(12) United States Patent
Datta et al.

(10) Patent No.: US 12,531,527 B2
(45) Date of Patent: Jan. 20, 2026

(54) GAIN BOOSTING IN POWER AMPLIFIERS USING RF-COUPLED FEEDBACK

(71) Applicant: Skyworks Solutions, Inc., Irvine, CA (US)

(72) Inventors: Kunal Datta, Sunnyvale, CA (US); Khaled A. Fayed, Marion, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 637 days.

(21) Appl. No.: 17/956,548

(22) Filed: Sep. 29, 2022

(65) Prior Publication Data

US 2023/0114571 A1  Apr. 13, 2023

Related U.S. Application Data

(60) Provisional application No. 63/255,306, filed on Oct. 13, 2021.

(51) Int. Cl.
*H03F 3/24* (2006.01)
*H03F 1/02* (2006.01)
(Continued)

(52) U.S. Cl.
CPC ........... *H03F 3/245* (2013.01); *H03F 1/0227* (2013.01); *H03F 3/195* (2013.01); *H03F 3/602* (2013.01); *H01L 23/28* (2013.01); *H01L 24/48* (2013.01); *H01L 2224/48151* (2013.01); *H03F 2200/06* (2013.01); *H03F 2200/09* (2013.01); *H03F 2200/102* (2013.01); *H03F 2200/117* (2013.01);
(Continued)

(58) Field of Classification Search
CPC .. H03F 3/245; H03F 1/0227; H03F 2200/117; H03F 2200/537; H03F 3/602; H03F 3/195; H03F 2200/451; H03F 2200/144; H03F 2200/534; H03F 2200/541; H03F 2200/06; H03F 2200/09; H01L 23/28; H01L 24/48; H01L 2224/48151
USPC ....................................................... 330/263
See application file for complete search history.

(56) References Cited

U.S. PATENT DOCUMENTS 3,835,406 A    9/1974  Thompson
5,847,626 A   12/1998  Taguchi et al.
(Continued)

OTHER PUBLICATIONS

Ho, M., Guo, J., Mui, T.W., Mak, K.H., Goh, W.L., Poon, H.C., Bu, S., Lau, M.W. and Leung, K.N., 2016. A two-stage large-capacitive-load amplifier with multiple cross-coupled small-gain stages. IEEE Transactions on Very Large Scale Integration (VLSI) Systems, 24(7), pp. 2580-259.

(Continued)

*Primary Examiner* — Andrea Lindgren Baltzell
*Assistant Examiner* — Lance Torbjorn Bartol
(74) *Attorney, Agent, or Firm* — Knobbe. Martens, Olson & Bear, LLP

(57) ABSTRACT

A power amplifier comprises a first amplification stage having an input terminal receiving a radio frequency (RF) signal to be amplified and having a first coupling unit, a second amplification stage outputting an amplified radio frequency signal and having a second coupling unit and a third coupling unit providing RF feedback to the input terminal of the first amplification stage through an RF feedback path, the second coupling unit being coupled to the first coupling unit, and the third coupling unit being coupled to the first coupling unit.

20 Claims, 20 Drawing Sheets

(51) Int. Cl.
  *H03F 3/195* (2006.01)
  *H03F 3/60* (2006.01)
  *H01L 23/00* (2006.01)
  *H01L 23/28* (2006.01)

(52) U.S. Cl.
  CPC .. *H03F 2200/144* (2013.01); *H03F 2200/451* (2013.01); *H03F 2200/534* (2013.01); *H03F 2200/537* (2013.01); *H03F 2200/541* (2013.01)

(56) References Cited

U.S. PATENT DOCUMENTS

| | | |
|---|---|---|
| 5,983,340 A | 11/1999 | Garey et al. |
| 6,151,509 A | 11/2000 | Chorey |
| 6,529,716 B1 | 3/2003 | Eidson et al. |
| 6,559,722 B1 | 5/2003 | Lopez et al. |
| 6,681,101 B1 | 1/2004 | Eidson et al. |
| 6,822,511 B1 | 11/2004 | Doherty et al. |
| 6,825,725 B1 | 11/2004 | Doherty et al. |
| 6,882,220 B2 | 4/2005 | Doherty et al. |
| 6,917,243 B2 | 7/2005 | Doherty et al. |
| 6,937,102 B2 | 8/2005 | Lopez et al. |
| 6,998,920 B2 | 2/2006 | Krutko et al. |
| 7,385,447 B1 | 6/2008 | Adar |
| 7,471,154 B2 | 12/2008 | Thompson |
| 7,482,868 B2 | 1/2009 | Hageman et al. |
| 7,545,217 B1 | 6/2009 | Reyes |
| 8,350,418 B2 | 1/2013 | Metzger et al. |
| 8,514,016 B2 | 8/2013 | Ripley et al. |
| 8,666,337 B2 | 3/2014 | Ripley et al. |
| 9,048,284 B2 | 6/2015 | Mcpartlin et al. |
| 9,083,455 B2 | 7/2015 | Popplewell et al. |
| 9,093,967 B2 | 7/2015 | Gorbachov |
| 9,246,443 B2 | 1/2016 | Shi et al. |
| 9,344,140 B2 | 5/2016 | Reisner et al. |
| 9,391,648 B2 | 7/2016 | Popplewell et al. |
| 9,419,073 B2 | 8/2016 | Mcpartlin et al. |
| 9,425,833 B2 | 8/2016 | Popplewell et al. |
| 9,429,975 B2 | 8/2016 | Alon et al. |
| 9,450,541 B2 | 9/2016 | Beltran et al. |
| 9,467,115 B2 | 10/2016 | Lyalin |
| 9,571,139 B2 | 2/2017 | Alon et al. |
| 9,628,134 B2 | 4/2017 | Reisner et al. |
| 9,660,600 B2 | 5/2017 | Whittaker |
| 9,660,606 B2 | 5/2017 | Lyalin et al. |
| 9,698,832 B2 | 7/2017 | Popplewell et al. |
| 9,712,119 B2 | 7/2017 | Datta et al. |
| 9,761,700 B2 | 9/2017 | Mcpartlin |
| 9,768,740 B2 | 9/2017 | Zhang et al. |
| 9,800,207 B2 | 10/2017 | Datta et al. |
| 9,813,029 B2 | 11/2017 | Zhu et al. |
| 9,818,821 B2 | 11/2017 | Mcpartlin et al. |
| 9,837,972 B2 | 12/2017 | Arkiszewski et al. |
| 9,853,610 B2 | 12/2017 | Beltran et al. |
| 9,882,587 B2 | 1/2018 | Feng et al. |
| 9,887,669 B2 | 2/2018 | Shi et al. |
| 9,912,298 B2 | 3/2018 | Lyalin et al. |
| 9,912,299 B2 | 3/2018 | Lyalin |
| 9,935,593 B2 | 4/2018 | Lyalin |
| 10,033,423 B2 | 7/2018 | Reisner et al. |
| 10,103,254 B2 | 10/2018 | Mcpartlin |
| 10,110,183 B2 | 10/2018 | Lyalin et al. |
| 10,110,184 B2 | 10/2018 | Lyalin et al. |
| 10,177,838 B2 | 1/2019 | Ripley |
| 10,205,426 B2 | 2/2019 | Zhu et al. |
| 10,263,072 B2 | 4/2019 | Mcpartlin et al. |
| 10,263,594 B2 | 4/2019 | Lyalin et al. |
| 10,284,153 B2 | 5/2019 | Quaglietta et al. |
| 10,291,185 B2 | 5/2019 | Lyalin et al. |
| 10,320,345 B2 | 6/2019 | Sharma et al. |
| 10,355,647 B2 | 7/2019 | Datta et al. |
| 10,355,724 B2 | 7/2019 | Feng et al. |
| 10,411,662 B2 | 9/2019 | Lyalin et al. |
| 10,418,945 B2 | 9/2019 | Whittaker |
| 10,469,316 B2 | 11/2019 | Hou et al. |
| 10,511,272 B2 | 12/2019 | Lyalin |
| 10,522,617 B2 | 12/2019 | Mcpartlin et al. |
| 10,554,177 B2 | 2/2020 | Lyalin et al. |
| 10,554,294 B2 | 2/2020 | Ripley |
| 10,574,191 B2 | 2/2020 | Zhu et al. |
| 10,587,231 B2 | 3/2020 | Shi et al. |
| 10,601,655 B2 | 3/2020 | Hou et al. |
| 10,615,758 B2 | 4/2020 | Arkiszewski et al. |
| 10,616,053 B2 | 4/2020 | Hou et al. |
| 10,658,991 B2 | 5/2020 | Lyalin et al. |
| 10,693,422 B2 | 6/2020 | Pan et al. |
| 10,749,512 B2 | 8/2020 | Balteanu et al. |
| 10,778,152 B2 | 9/2020 | Lyalin et al. |
| 10,886,953 B2 | 1/2021 | Feng et al. |
| 10,892,715 B2 | 1/2021 | Pan et al. |
| 10,944,367 B2 | 3/2021 | Lyalin et al. |
| 11,031,915 B2 | 6/2021 | Lyalin |
| 11,070,171 B2 | 7/2021 | Datta et al. |
| 11,070,174 B2 | 7/2021 | Lyalin et al. |
| 11,088,909 B2 | 8/2021 | Hou et al. |
| 11,101,775 B2 | 8/2021 | Datta et al. |
| 11,190,182 B2 | 11/2021 | Balteanu et al. |
| 11,431,327 B2 | 8/2022 | Balteanu et al. |
| 11,482,975 B2 | 10/2022 | Lyalin et al. |
| 11,502,646 B2 | 11/2022 | Lyalin et al. |
| 11,552,598 B2 | 1/2023 | Pan et al. |
| 11,601,144 B2 | 3/2023 | Loh et al. |
| 11,646,782 B2 | 5/2023 | Wloczysiak |
| 11,671,122 B2 | 6/2023 | Loh et al. |
| 11,677,368 B2 | 6/2023 | Lyalin et al. |
| 11,689,202 B2 | 6/2023 | Balteanu et al. |
| 11,750,151 B2 | 9/2023 | Datta et al. |
| 11,764,734 B2 | 9/2023 | Datta et al. |
| 11,855,595 B2 | 12/2023 | Lyalin et al. |
| 11,855,663 B2 | 12/2023 | Loh et al. |
| 11,870,643 B2 | 1/2024 | Hou et al. |
| 12,028,072 B2 | 7/2024 | Balteanu et al. |
| 12,088,330 B2 | 9/2024 | Loh et al. |
| 12,278,602 B2 | 4/2025 | Goto et al. |
| 2013/0147427 A1 | 6/2013 | Polu et al. |
| 2014/0001567 A1 | 1/2014 | Mcpartlin |
| 2014/0001602 A1 | 1/2014 | Mcpartlin |
| 2014/0001608 A1 | 1/2014 | Mcpartlin |
| 2014/0320252 A1 | 10/2014 | Sun et al. |
| 2016/0261234 A1* | 9/2016 | Ro .................. H03F 3/16 |
| 2017/0005624 A1 | 1/2017 | Zhu et al. |
| 2017/0005626 A1 | 1/2017 | Zhu et al. |
| 2019/0079549 A1 | 3/2019 | Lam et al. |
| 2019/0131438 A1 | 5/2019 | Mcpartlin |
| 2019/0245508 A1 | 8/2019 | Lyalin et al. |
| 2019/0363684 A1 | 11/2019 | Sharma et al. |
| 2020/0036335 A1 | 1/2020 | Whittaker |
| 2020/0099340 A1 | 3/2020 | Sharma et al. |
| 2020/0127614 A1 | 4/2020 | Quaglietta et al. |
| 2020/0220756 A1 | 7/2020 | Pan et al. |
| 2021/0036664 A1 | 2/2021 | Mao et al. |
| 2021/0211145 A1 | 7/2021 | Loh et al. |
| 2022/0021354 A1* | 1/2022 | Jiang .................. H03F 1/223 |
| 2022/0045647 A1 | 2/2022 | Chien et al. |
| 2022/0231640 A1 | 7/2022 | Lyalin |
| 2022/0376662 A1 | 11/2022 | Datta et al. |
| 2022/0376733 A1 | 11/2022 | Datta et al. |
| 2022/0416739 A1* | 12/2022 | Wen .................. H03F 3/265 |
| 2023/0006616 A1 | 1/2023 | Datta et al. |
| 2023/0006617 A1 | 1/2023 | Datta et al. |
| 2023/0006622 A1 | 1/2023 | Datta et al. |
| 2023/0024830 A1 | 1/2023 | Datta et al. |
| 2023/0063006 A1 | 3/2023 | Khesbak et al. |
| 2023/0065303 A1 | 3/2023 | Khesbak et al. |
| 2023/0065932 A1 | 3/2023 | Khesbak et al. |
| 2023/0104305 A1 | 4/2023 | Lyalin et al. |
| 2023/0105489 A1 | 4/2023 | Lyalin et al. |
| 2023/0113416 A1 | 4/2023 | Datta et al. |
| 2023/0117991 A1 | 4/2023 | Chyurlia et al. |
| 2023/0246606 A1 | 8/2023 | Xie et al. |
| 2023/0291359 A1 | 9/2023 | Ji et al. |
| 2023/0291370 A1 | 9/2023 | Lyalin et al. |
| 2023/0299729 A1 | 9/2023 | Chen et al. |
| 2023/0327615 A1 | 10/2023 | Chen et al. |

(56) References Cited

U.S. PATENT DOCUMENTS

| | | |
|---|---|---|
| 2023/0344452 A1 | 10/2023 | Loh et al. |
| 2023/0361724 A1 | 11/2023 | Chen et al. |
| 2023/0361850 A1 | 11/2023 | Wloczysiak |
| 2023/0378917 A1 | 11/2023 | Kundur et al. |
| 2023/0402988 A1 | 12/2023 | Datta et al. |
| 2024/0048101 A1 | 2/2024 | Datta et al. |
| 2024/0079998 A1 | 3/2024 | Drogi et al. |
| 2024/0080005 A1 | 3/2024 | Drogi et al. |
| 2024/0088849 A1 | 3/2024 | Lyalin et al. |

OTHER PUBLICATIONS

Lin, Y.S., Chang, J.F. and Lu, S.S., 2011. Analysis and design of CMOS distributed amplifier using inductively peaking cascaded gain cell for UWB systems. IEEE Transactions on Microwave Theory and Techniques, 59(10), pp. 2513-2524.

* cited by examiner

| ssfreq | ...0,::]/1e6 |
|---|---|
| 100000... | 10.000 |
| 300000... | 30.000 |
| 500000... | 50.000 |
| 700000... | 70.000 |
| 900000... | 90.000 |
| 10000... | 100.000 |
| 200000... | 200.000 |
| 300000... | 300.000 |
| 400000... | 400.000 |
| 500000... | 500.000 |
| 600000... | 600.000 |
| 700000... | 700.000 |

GAIN BOOSTING IN POWER AMPLIFIERS USING RF-COUPLED FEEDBACK

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 63/255,306, filed Oct. 13, 2021, titled "GAIN BOOSTING IN ENVELOPE TRACKING-CAPABLE POWER AMPLIFIERS USING RF-COUPLED FEEDBACK" are hereby incorporated by reference under 37 CFR 1.57 in their entirety.

BACKGROUND

Technical Field

Embodiments of the invention relate to electronic systems, and in particular to power amplifiers for electronic devices used in radio frequency (RF) communication systems.

Description of the Related Technology

Examples of RF communication systems in which power amplifiers are used include, but are not limited to, mobile phones, tablets, base stations, network access points, laptops, and wearable electronics. Power amplifiers provide amplification to RF signals, which can have a frequency in the range from about 30 kHz to 300 GHz, for instance, in the range of about 410 MHz to about 7.125 GHz for Fifth Generation (5G) cellular communications in Frequency Range 1 (FR1). Generally, it is important to manage the power of RF signal transmissions to prolong battery life and/or to provide suitable transmit power levels. An RF signal can have a frequency in the range of about 30 kHz to 300 GHz, such as in the range of about 410 MHz to about 7.125 GHz for fifth generation (5G) communications using Frequency Range 1 (FR1) or in the range of about 24.25 GHz to 52.6 GHz for 5G communications using Frequency Range 2 (FR2).

Two-Stage power amplifiers operating in the new 5G-NR Tx bands (3.3 GHz-5 GHz) are unable to produce enough power gain for proper functioning of the power amplifier module used in RF communication systems because the new 5G-NR Tx bands have a higher frequency of operation. At these higher operational frequencies, the transistor device parasitics (especially the collector-base capacitance when the power amplifier is realized by bipolar transistors) in the existing InGaAsP technology puts a fundamental limit of gain available from the electronic devices used in the RF communication systems. This is especially relevant in power amplifier modules which need to support both APT (average power tracking) and ET (envelope tracking) operations. Achieving sufficient gain in ET mode of operation is an added challenge, since envelop tracking requires a two-stage power amplifier to operate in gain compressed region, further limiting the available large signal power gain from the power amplifier module. Thus, there is a need and high demand for a two-stage power amplifier which can achieve the desired high gain and a wide-band 100 MHz modulation band-width particularly in ET mode of operation at 5G-NR Tx frequencies.

SUMMARY

In certain embodiments, this disclosure relates to a power amplifier comprising a first amplification stage having an input terminal receiving a radio frequency (RF) signal to be amplified and having a first coupling unit, a second amplification stage outputting an amplified radio frequency signal and having a second coupling unit, and a third coupling unit providing RF-coupled feedback to the input terminal of the first amplification stage through an RF-coupled feedback path, the second coupling unit being coupled to the first coupling unit; and the third coupling unit being coupled to the first coupling unit.

In other embodiments of this disclosure the first, second and third coupling units respectively comprise at least one coil.

In other embodiments of this disclosure the first and the second coupling units and the first and the third coupling units are inductively or RF coupled.

In other embodiments of this disclosure the first amplification stage comprises a bipolar transistor having a base, a collector, and an emitter.

In other embodiments of this disclosure the second amplification stage comprises two amplifier portions in push-pull arrangement.

In other embodiments of this disclosure the second amplification stage operates on differential signals.

In other embodiments of this disclosure the first amplification stage operates on single-ended signals.

In other embodiments of this disclosure the first and second coupling units from an inter-stage balun between the first and second amplification stage to convert a single-ended first amplification stage signal into a differential signal to drive the second amplification stage.

In other embodiments of this disclosure the power amplifier further comprises a first-stage power supply terminal and a ground terminal wherein the first coupling unit is connected between the first stage power supply terminal and the collector of the bipolar transistor.

In other embodiments of this disclosure the third coupling unit is connected between the ground terminal and the base of the bipolar transistor.

In other embodiments of this disclosure the power amplifier further comprises a first capacitor and a second capacitor wherein the first capacitor is provided between the collector and the base of the bipolar transistor and the second capacitor is provided in the RF feedback path between the third coupling unit and the base of the bipolar transistor.

In other embodiments of this disclosure the power amplifier further comprises a die wherein the balun is an on-die balun for converting the single ended first stage signal into the differential signal.

In certain other embodiments, the disclosure also relates to a method for boosting gain in a 2-stage power amplifier, the method comprising amplifying a radio frequency (RF) signal by a first amplification stage having an input terminal for receiving the radio frequency (RF) signal and having a first coupling unit, coupling the radio frequency signal amplified by the first amplification stage by the first coupling unit to a second coupling unit of a second amplification stage, amplifying the amplified signal coupled to the second coupling unit by the second amplification stage and outputting the amplified signal from the second amplification stage, coupling a third coupling unit to the first coupling unit; and providing RF feedback to the input terminal of the first amplification stage through an RF feedback path from the third coupling unit coupled to the first coupling unit.

In other embodiments of this disclosure relating to the above method, the coupling the second coupling unit to the first coupling unit and coupling the third coupling unit to the first coupling unit comprises an inductive or RF coupling.

In other embodiments of this disclosure the method further comprises operating the second amplification stage on differential signals.

In other embodiments of this disclosure, the method further comprises operating the first amplification stage on single-ended signals.

In other embodiments of this disclosure, the method further comprises converting a single-ended first amplification stage signal into a differential signal to drive the second amplification stage.

In other embodiments of this disclosure, the method further comprises connecting the first coupling unit between the ground terminal and the collector of the bipolar transistor.

In other embodiments of this disclosure the method further comprises connecting the third coupling unit between the ground terminal and the base of a bipolar transistor in the first amplification stage.

In other embodiments of this disclosure the method further comprises providing a first capacitor between the collector and the base of the bipolar transistor and a second capacitor in the RF feedback path between the third coupling unit and a base of the bipolar transistor.

In other embodiments of this disclosure, the invention also relates to the use of a power amplifier as defined above for amplifying a radio frequency signal with the first amplification stage and the second amplification stage.

In other embodiments of this disclosure, the invention also relates to a mobile device comprising a transceiver configured to generate a radio frequency signal, a power management system including an envelope tracker configured to generate a power amplifier supply voltage that changes is relation to an envelope of the radio frequency signal, and a power amplifier module including a power amplifier configured to amplify the radio frequency signal and to receive power from the power amplifier supply voltage, the power amplifier module further including a power amplifier as defined above.

In other embodiments of this disclosure, the envelope tracker includes a DC-to-DC converter and an error amplifier configured to operate in parallel with one another to generate the power amplifier supply voltage.

In other embodiments of this disclosure, the error amplifier is included on the power amplifier module, and the DC-to-DC converter is external to the power amplifier module.

In other embodiments of this disclosure, the invention also relates to an envelope tracking system comprising an envelope tracker configured to generate a power amplifier supply voltage that changes in relation to an envelope of a radio frequency signal, and a power amplifier module including a power amplifier configured to amplify the radio frequency signal and to receive power from the power amplifier supply voltage, the power amplifier module, the power amplifier module further including a power amplifier as defined above.

In other embodiments of this disclosure, the invention also relates to a method of radio frequency signal amplification in a mobile device using envelope tracking, the method comprising generating a power amplifier supply voltage that changes its relation to an envelope of a radio frequency input signal using an envelope tracker, powering a power amplifier using the power amplifier supply voltage, amplifying the radio frequency signal using the power amplifier, the amplifying comprising amplifying the radio frequency (RF) signal by a first amplification stage having an input terminal for receiving the radio frequency (RF) signal and having a first coupling unit, coupling the radio frequency signal amplified by the first amplification stage by the first coupling unit to a second coupling unit of a second amplification stage, amplifying the amplified signal coupled to the second coupling unit by the second amplification stage and outputting the amplified signal from the second amplification stage, coupling a third coupling unit to the first coupling unit, and providing RF-coupled feedback to the input terminal of the first amplification stage through an RF feedback path from the third coupling unit coupled to the first coupling unit.

In other embodiments of this disclosure, generating the power amplifier supply voltage includes outputting a plurality of regulated voltages from a DC-to-DC converter, generating a modulator output voltage based on the plurality of regulated voltages and the envelope of the radio frequency signal using a modulator, and filtering the modulator output voltage to generate the power amplifier supply voltage using a modulator output filter.

In other embodiments of this disclosure, generating the power amplifier supply voltage includes tracking the envelope using a DC-to-DC converter and an error amplifier operating in parallel. In yet other embodiments of this disclosure, the invention also relates to a packaged module comprising a die, surface mount components, wirebonds, a package substrate, and an encapsulation structure, the package substrate including pads formed from conductors disposed therein, the die further including pads, the wirebonds electrically connecting the pads of the die to the pads of the package substrate, and the die including a power amplifier as defined above.

In other embodiments of this disclosure, the invention also relates to a phone board comprising the packaged module as defined above. In yet other embodiments of this disclosure, the invention also relates to a power amplifier comprising a first amplification stage having an input terminal receiving a radio frequency (RF) signal to be amplified and having a first coupling unit, a third coupling unit providing RF-coupled feedback to the input terminal of the first amplification stage through an RF-coupled feedback path; and the third coupling unit being coupled to the first coupling unit.

In other embodiments of this disclosure, the power amplifier further comprises a second amplification stage having a second coupling unit wherein the second coupling unit is coupled to the first coupling unit. In additional embodiments of this disclosure the first and third coupling units respectively comprise at least one coil. In further embodiments of this disclosure the first and the third coupling unit are inductively or RF coupled.

In other embodiments of this disclosure the first amplification stage comprises a bipolar transistor having a base, a collector, and an emitter. In yet other embodiments of this disclosure the first amplification stage operates on single-ended signals. In additional embodiments of this disclosure, the power amplifier further comprises a first-stage power supply terminal and a ground terminal wherein the first coupling unit is connected between the first stage power supply terminal and the collector of the bipolar transistor.

In other embodiments of this disclosure the third coupling unit is connected between the ground terminal and the base of the bipolar transistor. In yet other embodiments of this disclosure, the power amplifier further comprises a first capacitor and a second capacitor wherein the first capacitor is provided between the collector and the base of the bipolar transistor and the second capacitor is provided in the RF feedback path between the third coupling unit and the base of the bipolar transistor.

In one embodiment, a power amplifier comprises a first amplification stage having an input terminal receiving a radio frequency signal to be amplified and having a first coupling unit, a second amplification stage outputting an amplified radio frequency signal and having a second coupling unit that is inductively coupled with the first coupling unit, and a third coupling unit inductively coupled with the first coupling unit, the third coupling unit provides radio frequency-coupled feedback to the input terminal of the first amplification stage through a radio frequency-coupled feedback path.

In another embodiment the power amplifier the first, second and third coupling units respectively include at least one coil. In other embodiments, the first amplification stage includes a bipolar transistor having a base, a collector, and an emitter. In yet other embodiments, the second amplification stage includes two amplifier portions in push-pull arrangement. In additional embodiments, the second amplification stage operates on differential signals. In further embodiments, the first amplification stage operates on single-ended signals.

In other embodiments, the first and second coupling units form an inter-stage balun between the first and second amplification stages to convert a single-ended first amplification stage signal into a differential signal to drive the second amplification stage. In yet other embodiments, the power amplifier further comprises a first stage power supply terminal and a ground terminal, the first coupling unit being connected between the first stage power supply terminal and the collector of the bipolar transistor. In additional embodiments, the third coupling unit is connected between the ground terminal and the base of the bipolar transistor. In further embodiments, the power amplifier further comprises a first capacitor and a second capacitor, the first capacitor being provided between the collector and the base of the bipolar transistor and the second capacitor being provided in the radio frequency-coupled feedback path between the third coupling unit and the base of the bipolar transistor.

In other embodiments, the power amplifier further comprises a die, the inter-stage balun being an on-die balun for converting the single ended first amplification stage signal into the differential signal.

Other embodiments disclose a method for boosting gain in a power amplifier, the method comprising amplifying a radio frequency signal by a first amplification stage having an input terminal for receiving the radio frequency signal and having a first coupling unit, inductively coupling the first coupling unit with a second coupling unit of a second amplification stage, amplifying the amplified radio frequency signal with a second amplification stage coupled to the second coupling unit and outputting the amplified radio frequency signal from the second amplification stage, inductively coupling a third coupling unit to the first coupling unit; and providing radio frequency feedback to the input terminal of the first amplification stage through a radio frequency feedback path from the third coupling unit to the first coupling unit.

In other embodiments the method comprises operating the second amplification stage on differential signals. In yet other embodiments, the method further comprises operating the first amplification stage on single-ended signals. In additional embodiments, the method comprises comprising converting a single-ended first amplification stage signal into a differential signal to drive the second amplification stage. In a further embodiments, the method further comprises connecting the first coupling unit between a ground terminal and a collector of a bipolar transistor.

In other embodiments, the method further comprises connecting the third coupling unit between a ground terminal and a base of a bipolar transistor in the first amplification stage. In yet other embodiments the method further comprises providing a first capacitor between a collector and the base of the bipolar transistor and a second capacitor in the radio frequency feedback path between the third coupling unit and a base of the bipolar transistor.

In other embodiments a mobile device comprises a transceiver configured to generate a radio frequency signal, a first amplification stage having an input terminal receiving a radio frequency signal to be amplified and having a first coupling unit, a second amplification stage outputting an amplified radio frequency signal and having a second coupling unit that is inductively coupled with the first coupling unit, and a third coupling unit inductively coupled with the first coupling unit, the third coupling unit provides radio frequency-coupled feedback to the input terminal of the first amplification stage through a radio frequency-coupled feedback path.

In other embodiments, the first and second coupling units form an inter-stage balun between the first and second amplification stages to convert a single-ended first amplification stage signal into a differential signal to drive the second amplification stage.

In yet other embodiments, an envelope tracking system comprises an envelope tracker configured to generate a power amplifier supply voltage that changes is relation to an envelope of a radio frequency signal, and a power amplifier module including a first amplification stage having an input terminal receiving the radio frequency signal and having a first coupling unit, and a second coupling unit inductively coupled with the first coupling unit, the second coupling unit provides radio frequency-coupled feedback to the input terminal of the first amplification stage through a radio frequency-coupled feedback path.

In other embodiments, the first and second coupling units of the envelope tracking system include at least one coil. In yet other embodiments the first amplification stage operates on single-ended signals. In additional embodiments, the first amplification stage includes a bipolar transistor having a base, a collector, and an emitter. In further embodiments, the envelope tracking system further comprises a first-stage power supply terminal and a ground terminal, the first coupling unit being connected between a first stage power supply terminal and the collector of the bipolar transistor. In still further embodiments, the second coupling unit is connected between the ground terminal and the base of the bipolar transistor.

In other embodiments, the envelope tracking system further comprises a first capacitor and a second capacitor, the first capacitor provided between the collector and the base of the bipolar transistor and the second capacitor provided in the radio frequency feedback path between the second coupling unit and the base of the bipolar transistor.

Other embodiments include a method of radio frequency signal amplification in a mobile device using envelope tracking. The method comprises generating a power amplifier supply voltage that changes is relation to an envelope of a radio frequency input signal using an envelope tracker, powering a power amplifier using the power amplifier supply voltage, amplifying the radio frequency input signal using the power amplifier, the amplifying including amplifying the radio frequency signal by a first amplification stage having an input terminal for receiving the radio frequency input signal and having a first coupling unit, inductively coupling the radio frequency signal amplified by the first amplification stage by the first coupling unit to a second coupling unit, and providing radio frequency-coupled feedback to the input terminal of the first amplification stage through an radio frequency feedback path from the second coupling unit to the first coupling unit.

In other embodiments, generating the power amplifier supply voltage includes outputting a plurality of regulated voltages from a direct current-to-direct current converter, generating a modulator output voltage based on the plurality of regulated voltages and the envelope of the radio frequency input signal using a modulator, and filtering the modulator output voltage to generate the power amplifier supply voltage using a modulator output filter. In yet other embodiments, generating the power amplifier supply voltage includes tracking the envelope using a direct current-to-direct current converter and an error amplifier operating in parallel. In additional embodiments, the method further comprises operating the first amplification stage on single-ended signals.

In other embodiments, the method further comprises converting a single-ended first amplification stage signal into a differential signal. In yet other embodiments, the method further comprises connecting the first coupling unit between a ground terminal and a collector of a bipolar transistor. In additional embodiments, the method further comprises connecting the second coupling unit between a ground terminal and a base of a bipolar transistor in the first amplification stage. In other embodiments, the method further comprises providing a first capacitor between a collector and the base of the bipolar transistor and a second capacitor in the radio frequency feedback path between the second coupling unit and a base of the bipolar transistor.

Other embodiments disclose a packaged module comprising a die including pads, surface mount components, wirebonds, a package substrate including pads formed from conductors disposed therein, and an encapsulation structure, the wirebonds electrically connecting the pads of the die to the pads of the package substrate, and the die including a power amplifier including a first amplification stage having an input terminal receiving a radio frequency signal to be amplified and having a first coupling unit, a second coupling unit inductively coupled with the first coupling unit, the second coupling unit providing radio frequency-coupled feedback to the input terminal of the first amplification stage through a radio frequency-coupled feedback path. In yet other embodiments, the packaged module is mounted to a phone board.

Additional embodiments disclose A mobile device comprising a transceiver configured to generate a radio frequency signal, a power management system including an envelope tracker configured to generate a power amplifier supply voltage that changes in relation to an envelope of the radio frequency signal, and a power amplifier module including a power amplifier configured to amplify the radio frequency signal and to receive power from the power amplifier supply voltage, the power amplifier including a first amplification stage having an input terminal receiving the radio frequency signal to be amplified and having a first coupling unit, and a second coupling unit inductively coupled with the first coupling unit, the second coupling unit provides radio frequency-coupled feedback to the input terminal of the first amplification stage through an radio frequency-coupled feedback path.

In other embodiments, the envelope tracker of the mobile device includes a direct current-to-direct current converter and an error amplifier configured to operate in parallel with one another to generate the power amplifier supply voltage. In additional embodiments, the error amplifier of the mobile device is included on the power amplifier module, and the direct current-to-direct current converter is external to the power amplifier module.

The invention is, however, not limited to the above described embodiments and may comprise embodiments which result from any combination of one or more of the above embodiments.

BRIEF DESCRIPTION OF THE DRAWINGS

Embodiments of this disclosure will now be described, by way of non-limiting example, with reference to the accompanying drawings.

FIG. 12A shows the modulated gain meeting a desired specification of 28 dB at 5 GHz and where FIG. 12B shows the results for a 60 MHz and 80 MHz ET (envelope tracking) operation.

DETAILED DESCRIPTION OF CERTAIN EMBODIMENTS

Figure 1:
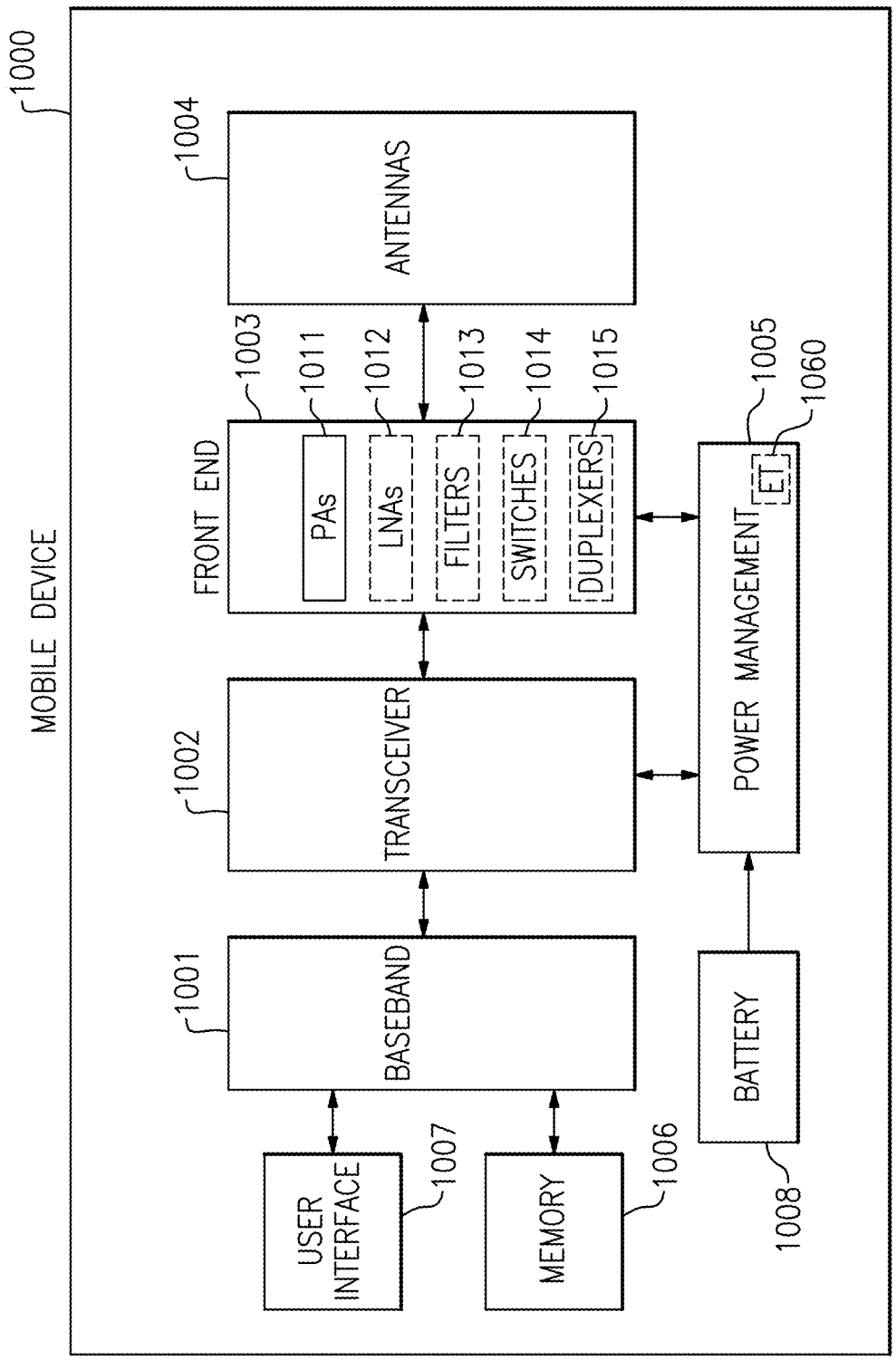
FIG. 1 is a schematic diagram of one embodiment of a mobile device in which a power amplifier may be used.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the Figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. Hereinafter, electronic devices used in RF (radio frequency) communication systems are described in which power amplifiers according to the invention are typically used.

Mobile Device Using a Power Amplifier

FIG. 1 is a schematic diagram of one example of such a mobile device 1000. The mobile device 1000 includes a baseband system 1001, a transceiver 1002, a front end system 1003, antennas 1004, a power management system 1005, a memory 1006, a user interface 1007, and a battery 1008.

The mobile device 1000 can be used communicate using a wide variety of communications technologies, including, but not limited to, 2G, 3G, 4G (including LTE, LTE-Advanced, and LTE-Advanced Pro), 5G, WLAN (for instance, Wi-Fi®), WPAN (for instance, Bluetooth® and ZigBee®), WMAN (for instance, WiMax®), and/or GPS technologies.

The transceiver 1002 generates RF signals for transmission and processes incoming RF signals received from the antennas 1004. It will be understood that various functionalities associated with the transmission and receiving of RF signals can be achieved by one or more components that are collectively represented in FIG. 1 as the transceiver 1002. In one example, separate components (for instance, separate circuits or dies) can be provided for handling certain types of RF signals.

The front end system 1003 aids is conditioning signals transmitted to and/or received from the antennas 1004. In the illustrated embodiment, the front end system 1003 includes power amplifiers (PAs) 1011, low noise amplifiers (LNAs) 1012, filters 1013, switches 1014, and duplexers 1015. The power amplifiers according to the invention can be used for the power amplifiers 1011. However, they can also be used in other devices and by no means is the example in FIG. 1 limiting the use of the power amplifiers of the invention. Other implementations are also possible.

The front end system 1003 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 1000 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 1004 can include antennas used for a wide variety of types of communications. For example, the antennas 1004 can include antennas associated transmitting and/or receiving signals associated with a wide variety of frequencies and communications standards.

In certain implementations, the antennas 1004 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 1000 can operate with beamforming in certain implementations. For example, the front end system 1003 can include phase shifters having variable phase controlled by the transceiver 1002. Additionally, the phase shifters are controlled to provide beam formation and directivity for transmission and/or reception of signals using the antennas 1004. For example, in the context of signal transmission, the phases of the transmit signals provided to the antennas 1004 are controlled such that radiated signals from the antennas 1004 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 1004 from a particular direction. In certain implementations, the antennas 1004 include one or more arrays of antenna elements to enhance beamforming.

The baseband system 1001 is coupled to the user interface 1007 to facilitate processing of various user input and output (I/O), such as voice and data. The baseband system 1001 provides the transceiver 1002 with digital representations of transmit signals, which the transceiver 1002 processes to generate RF signals for transmission. The baseband system 1001 also processes digital representations of received signals provided by the transceiver 1002. As shown in FIG. 1, the baseband system 1001 is coupled to the memory 1006 of facilitate operation of the mobile device 1000.

The memory 1006 can be used for a wide variety of purposes, such as storing data and/or instructions to facilitate the operation of the mobile device 1000 and/or to provide storage of user information.

The power management system 1005 provides a number of power management functions of the mobile device 1000. The power management system 1005 of FIG. 1 includes an envelope tracker 1060. As shown in FIG. 1, the power management system 1005 receives a battery voltage form the battery 1008. The battery 1008 can be any suitable battery for use in the mobile device 1000, including, for example, a lithium-ion battery.

The mobile device 1000 of FIG. 1 illustrates one example of an RF communication system that can include power amplifier(s) implemented in accordance with one or more features of the present disclosure. However, the teachings herein are applicable to RF communication systems implemented in a wide variety of ways. Since the power amplifiers of the invention are in one example specifically used in systems using envelope tracking (ET), a system will be illustrated with reference to FIG. 2 in which such an envelope tracking is employed.

Transmit System Including Envelope Tracker

Figure 2:
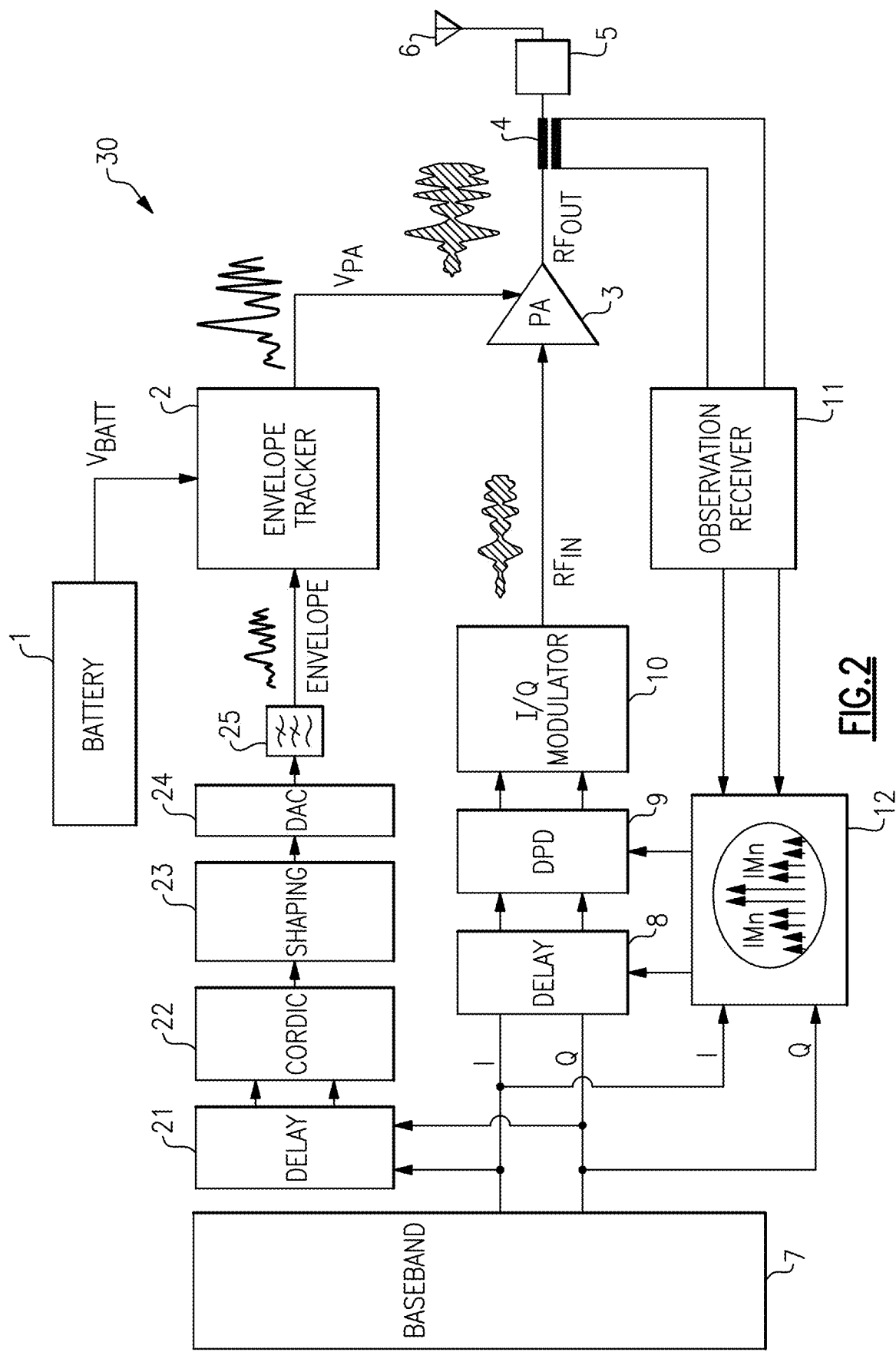
FIG. 2 is a schematic diagram of one embodiment of a transmit system for transmitting radio frequency (RF) signals from a mobile device using envelope tracking.

FIG. 2 illustrates a transmit system for transmitting RF signals from a mobile device. The transmit system 30 includes a battery 1, an envelope tracker 2, a power amplifier 3, a directional coupler 4, a duplexing and switching circuit 5, an antenna 6, a baseband processor 7, a signal delay circuit 8, a digital pre-distortion (DPD) circuit 9, an I/O modulator 10, an observation receiver 11, an intermodulation detection circuit 12, an envelope delay circuit 21, a coordinate rotation digital computation (CORDIC) circuit 22, a shaping circuit 23, a digital-to-analog converter 24, and a reconstruction filter 25.

The transmit system 30 of FIG. 2 illustrates one example of an RF communication system that can include power amplifier(s) implemented in accordance with one or more features of the present disclosure. However, the teachings herein are applicable to RF communication systems implemented in a wide variety of ways.

The baseband processor 7 operates to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals are provided to the I/O modulator 10 in a digital format. The baseband processor 7 can be any suitable processor configured to process a baseband signal. For instance, the baseband processor 7 can include a digital signal processor, a microprocessor, a programmable core, or any combination thereof.

The signal delay circuit 8 provides adjustable delay to the I and Q signals to aid in controlling relative alignment between the envelope signal and the RF signal $RF_{IN}$. The amount of delay provided by the signal delay circuit 8 is controlled based on amount of intermodulation detected by the intermodulation detection circuit 12.

The DPD circuit 9 operates to provide digital shaping to the delayed I and Q signals from the signal delay circuit 8 to generate digitally pre-distorted I and Q signals. In the illustrated embodiment, the DPD provided by the DPD circuit 9 is controlled based on amount of intermodulation detected by the intermodulation detection circuit 12. The DPD circuit 9 serves to reduce a distortion of the power amplifier 3 and/or to increase the efficiency of the power amplifier 3.

The I/O modulator 10 receives the digitally pre-distorted I and Q signals, which are processed to generate an RF signal $RF_{IN}$. For example, the I/O modulator 10 can include DACs configured to convert the digitally pre-distorted I and Q signals into an analog format, mixers for upconverting the analog I and Q signals to radio frequency, and a signal combiner for combining the upconverted I and Q signals into an RF signal suitable for amplification by the power amplifier 3. In certain implementations, the I/O modulator 10 can include one or more filters configured to filter frequency content of signals processed therein.

The envelope delay circuit 21 delays the I and Q signals from the baseband processor 7. Additionally, the CORDIC circuit 22 processes the delayed I and Q signals to generate a digital envelope signal representing an envelope of the RF signal $RF_{IN}$. Although FIG. 2 illustrates an implementation using the CORDIC circuit 22, an envelope signal can be obtained in other ways.

The shaping circuit 23 operates to shape the digital envelope signal to enhance the performance of the transmit system 30. In certain implementations, the shaping circuit 23 includes a shaping table that maps each level of the digital envelope signal to a corresponding shaped envelope signal level. Envelope shaping can aid in controlling linearity, distortion, and/or efficiency of the power amplifier 3.

In the illustrated embodiment, the shaped envelope signal is a digital signal that is converted by the DAC 24 to an analog envelope signal. Additionally, the analog envelope signal is filtered by the reconstruction filter 25 to generate an envelope signal suitable for use by the envelope tracker 2. In certain implementations, the reconstruction filter 25 includes a low pass filter.

With continuing reference to FIG. 2, the envelope tracker 2 receives the envelope signal from the reconstruction filter 25 and a battery voltage $V_{BATT}$ from the battery 1, and uses the envelope signal to generate a power amplifier supply voltage $V_{PA}$ for the power amplifier 3 that changes in relation to the envelope of the RF signal $RF_{IN}$. The power amplifier 3 receives the RF signal $RF_{IN}$ from the I/O modulator 10, and provides an amplified RF signal $RF_{OUT}$ to the antenna 6 through the duplexing and switching circuit 5, in this example.

The directional coupler 4 is positioned between the output of the power amplifier 3 and the input of the duplexing and switching circuit 5, thereby allowing a measurement of output power of the power amplifier 3 that does not include insertion loss of the duplexing and switching circuit 5. The sensed output signal from the directional coupler 4 is provided to the observation receiver 11, which can include mixers for down converting I and Q signal components of the sensed output signal, and DACs for generating I and Q observation signals from the down converted signals.

The intermodulation detection circuit 12 determines an intermodulation product between the I and Q observation signals and the I and Q signals from the baseband processor 7. Additionally, the intermodulation detection circuit 12 controls the DPD provided by the DPD circuit 9 and/or a delay of the signal delay circuit 8 to control relative alignment between the envelope signal and the RF signal $RF_{IN}$.

By including a feedback path from the output of the power amplifier 3 and baseband, the I and Q signals can be dynamically adjusted to optimize the operation of the transmit system 30. For example, configuring the transmit system 30 in this manner can aid in providing power control, compensating for transmitter impairments, and/or in performing DPD.

Although illustrated as a single stage, the power amplifier 3 can include one or more stages as will be explained below with more details. Furthermore, RF communication systems such as mobile devices can include multiple power amplifiers. In such implementations, separate envelope trackers can be provided for different power amplifiers and/or one or more shared envelope trackers can be used.

Envelope Tracking Operating with Power Amplifiers

The power amplifiers according to one example of the invention can be used for the power amplifier 3 shown and described above with reference to FIG. 2 or the power amplifiers 1011 in FIG. 1. Envelope tracking is a technique that can be used to increase power added efficiency (PAE) of a power amplifier by efficiently controlling a voltage level of a power amplifier supply voltage in relation to an envelope of the RF signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

In one example, an envelope tracker includes a DC-to-DC converter that operates in combination with an error amplifier to generate a power amplifier supply voltage based on an envelope signal. For example, the DC-to-DC converter and the error amplifier can be electrically connected in parallel with one another, and the DC-to-DC converter can track low frequency components of the envelope signal while the error amplifier can track high frequency components of the envelope signal. For example, the DC-to-DC converter's switching frequency can be reduced to be less than a maximum frequency component of the envelope signal, and the error amplifier can operate to smooth gaps in the converter's output to generate the power amplifier supply voltage. In certain implementations, the DC-to-DC converter and error amplifier are combined via a combiner.

In another example, an envelope tracker includes a multi-output boost switcher for generating regulated voltages of different voltage levels, a bank of switches for controlling selection of a suitable regulated voltage over time based on the envelope signal, and a filter for filtering the output of the switch bank to generate the power amplifier supply voltage.

Power amplifiers are also available with adaptive bias for envelope tracking applications. In certain embodiments, an envelope tracking system includes a power amplifier that amplifies an RF signal and that receives power from a power amplifier supply voltage, and an envelope tracker that generates the power amplifier supply voltage based on an envelope of the RF signal. Power amplifiers can be realized with bipolar transistors or field effect transistors (FETs). The power amplifier includes a field-effect transistor (FET) for amplifying the RF signal and a current mirror including an input that receives a reference current and an output connected to the power amplifier supply voltage. An internal voltage of the current mirror is used to bias the gate of the FET to compensate the FET for changes in the power amplifier supply voltage arising from envelope tracking.

By implementing the power amplifier with adaptive bias, non-idealities of the FET are compensated. For example, such adaptive biasing aids in compensating for channel length modulation and/or drain induced barrier lowering that would otherwise give rise to high variation in RF gain versus power amplifier supply voltage.

In certain implementations, the FET is implemented as a short channel metal oxide semiconductor (MOS) transistor. Although short channel MOS transistors suffer from a number of transistor non-idealities, adaptive biasing provides compensation that enables the short channel MOS transistor to be used in the power amplifier without significantly degrading the power amplifier's performance. Since short channel MOS transistors can be fabricated in processes that are low cost and/or enable high degrees of integration, it is desirable to implement a power amplifier using a short channel MOS transistor in a number of applications.

In certain implementations, a buffer is further included for buffering the internal voltage of the current mirror to generate the gate bias voltage of the FET. Including the buffer can enhance the bandwidth and speed-up the transient response of the power amplifier's biasing, thereby improving amplitude and phase distortion.

The current mirror can be implemented in a wide variety of ways. In certain implementations, the current mirror is implemented as a Wilson current mirror. For example, the current mirror can be implemented using n-type field-effect transistors (NFETs) arranged as a four transistor Wilson current mirror. For example, the drain-to-source voltage of a first NFET of a four transistor Wilson mirror can increase as voltage of the output decreases, and is well-suited for increasing the power amplifier's gain as power amplifier supply voltage decreases.

Figure 3:
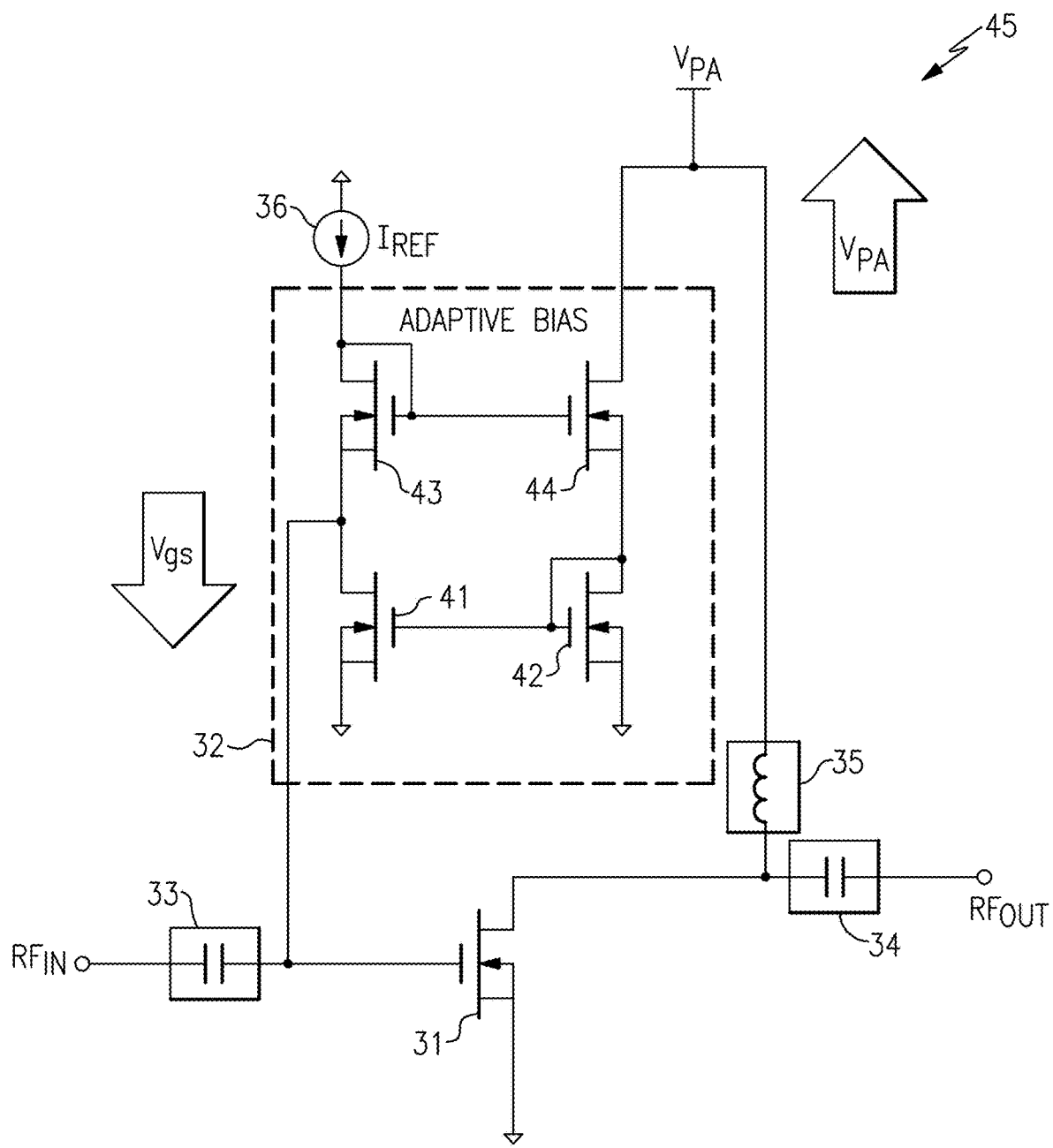
FIG. 3 is a schematic diagram of one example of a power amplifier system.

FIG. 3 is a schematic diagram of a power amplifier 45 using FETs. The power amplifier 45 includes an NFET 31, a Wilson current mirror 32, an input DC blocking capacitor 33, an output DC blocking capacitor 34, a choke inductor 35, and a reference current source 36.

Although FIG. 3 depicts one example of a power amplifier with adaptive bias with FETs, the teachings herein are applicable to power amplifiers implemented in a wide variety of ways and in particular the power amplifiers of the invention may be realized with bipolar transistors.

In the example in FIG. 3, the power amplifier 45 receives an RF input signal $RF_{IN}$ at an RF input terminal, and provides an amplified RF output signal RFOUT to an RF output terminal. In the illustrated embodiment, the input DC blocking capacitor 33 is connected between the RF input terminal and the gate of the NFET 31 to allow biasing of the gate voltage of the NFET 31 separately from the DC voltage of the RF input terminal. Additionally, the output DC blocking capacitor 34 is connected between the drain of the NFET 31 and the RF output terminal to decouple the drain voltage of the NFET 31 from the DC voltage of the RF output terminal.

As shown in FIG. 3, the choke inductor 35 provides the power amplifier supply voltage $V_{PA}$ to the drain of the NFET 31. The power amplifier supply voltage $V_{PA}$ can be generated by an envelope tracker including, but not limited to, any of the envelope trackers disclosed herein.

The NFET 31 amplifies the RF input signal $RF_{IN}$ to generate the RF output signal $RF_{OUT}$. Additionally, the gate of the NFET 31 is biased by an internal voltage of the Wilson current mirror 32. Furthermore, the source of the NFET 31 receives a ground voltage (ground), while the drain of the NFET 31 receives the power amplifier supply voltage $V_{PA}$ from the choke inductor 35. In certain implementations, the NFET 31 is implemented as an n-type metal oxide semiconductor (NMOS) transistor. For example, the NFET 31 can be a short channel NMOS transistor.

The Wilson current mirror 32 includes an input that receives a reference current $I_{REF}$ from a reference current source 36, and an output connected to the power amplifier supply voltage $V_{PA}$. The Wilson current mirror 32 includes a first current mirror NFET 41, a second current mirror NFET 42, a third current mirror NFET 43, and a fourth current mirror NFET 44.

As shown in FIG. 3, the first current mirror NFET 41 and the second current mirror NFET 42 each include a source connected to ground. Additionally, a gate of the first current mirror NFET 41 is connected to a gate and a drain of the second current mirror NFET 42 as well as to a source of the fourth current mirror NFET 44. Additionally, the output of the current mirror is connected to the drain of the fourth current mirror NFET 44, while the input of the current mirror is connected to a gate of the fourth current mirror NFET 44 and to a gate and a drain of the third current mirror NFET 43. Furthermore, the drain of the first current mirror NFET 41 and the source of the third current mirror NFET 43 are connected to one another.

In the illustrated example, an internal voltage of the Wilson current mirror 32 is provided to the gate of the NFET 31 to provide adaptive biasing. The internal voltage corresponds to the drain voltage of the first current mirror NFET 41, in this embodiment.

The Wilson current mirror 32 operates to mirror the reference current $I_{REF}$ received at the input to generate an output current provided at the output. As the power amplifier supply voltage $V_{PA}$ changes due to envelope tracking, the drain voltage of the first current mirror NFET 41 also changes such that the output current tracks the input current. The regulation of the Wilson current mirror results in the drain-to-source voltage of the first current mirror NFET 41 increasing as the power amplifier supply voltage $V_{PA}$ decreases.

The drain voltage of the first current mirror NFET 41 is well-suited for increasing the power amplifier's gain as the power amplifier supply voltage $V_{PA}$ decreases, and for decreasing the power amplifier's gain as the power amplifier supply voltage $V_{PA}$ increases. Thus, the Wilson current mirror 32 provides adaptive biasing to the NFET 31 to compensate for gain variation arising from power supply variation. Such adaptive biasing is well-suited for compensating for short channel effects (for instance, channel length modulation and/or drain-induced barrier lowering) when the NFET 31 is implemented as a short channel NMOS transistor.

Multistage Power Amplifier Modules

Figure 4:
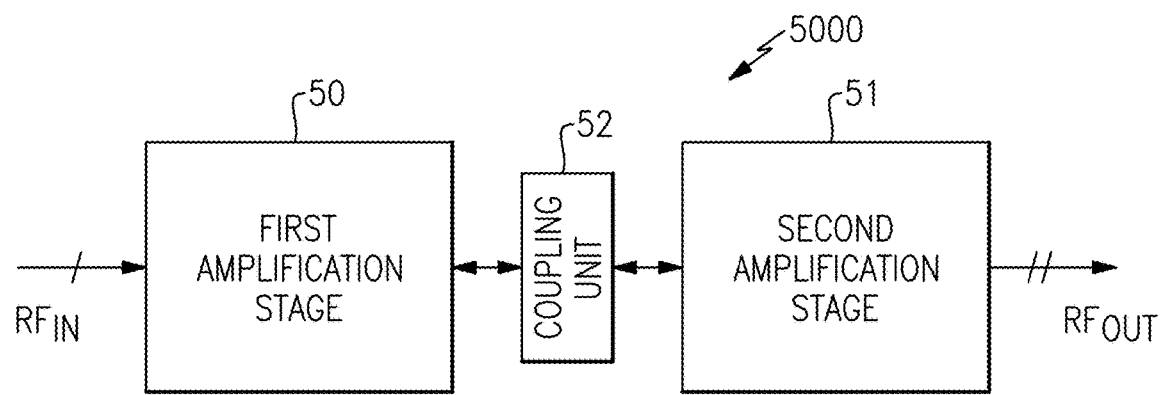
FIG. 4 is a block diagram of a conventional 2-stage power amplifier used in an RF communication system.

FIG. 4 shows a principal block diagram of a conventional 2-stage power amplifier usable in an RF communication system. It comprises a first amplification stage 50, a second amplification stage 51 and a coupling unit 52, which couples the first amplification stage 50 to the second amplification stage 51. Typically, the RF input signal to be amplified $RF_{IN}$ is a single-ended signal and the first amplification stage 50 operates on single-ended signals whilst the second amplification stage 51 operates on differential signals. The respective single-ended signal and the differential signals are respectively indicated with the single and double lines on the input signal $RF_{IN}$ and the output signal $RF_{OUT}$. As will be seen below, typically the coupling unit 52 provides an inductive or RF coupling between the first amplification stage 50 and the second amplification stage 51. Thus, the power amplifier 5000 shown in FIG. 4 provides a two-stage amplification of the input signal $RF_{IN}$ into the amplified signal $RF_{OUT}$.

Figure 5:
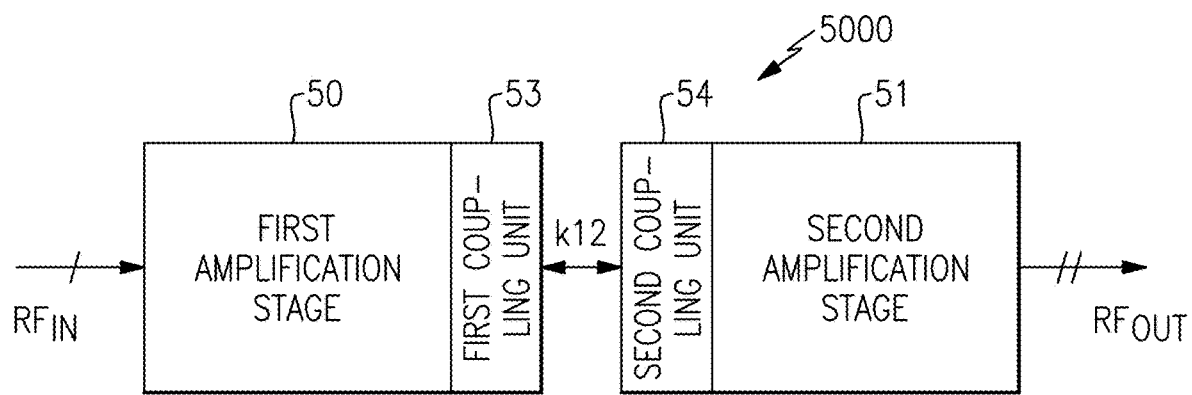
FIG. 5 is a principal block diagram of a conventional 2-stage power amplifier as in FIG. 4, showing further details thereof.

FIG. 5 shows the two-stage power amplifier 5000 shown in FIG. 4 with more details. In particular, used for the coupling unit 52 are a first coupling unit 53 and a second coupling unit 54, which are, in one example, inductively coupled through an inductive coupling with coupling coefficient k12. Otherwise, the operation of the power amplifier 5000 shown in FIG. 5 is the same as that of the power amplifier 5000 shown in FIG. 4.

Figure 6:
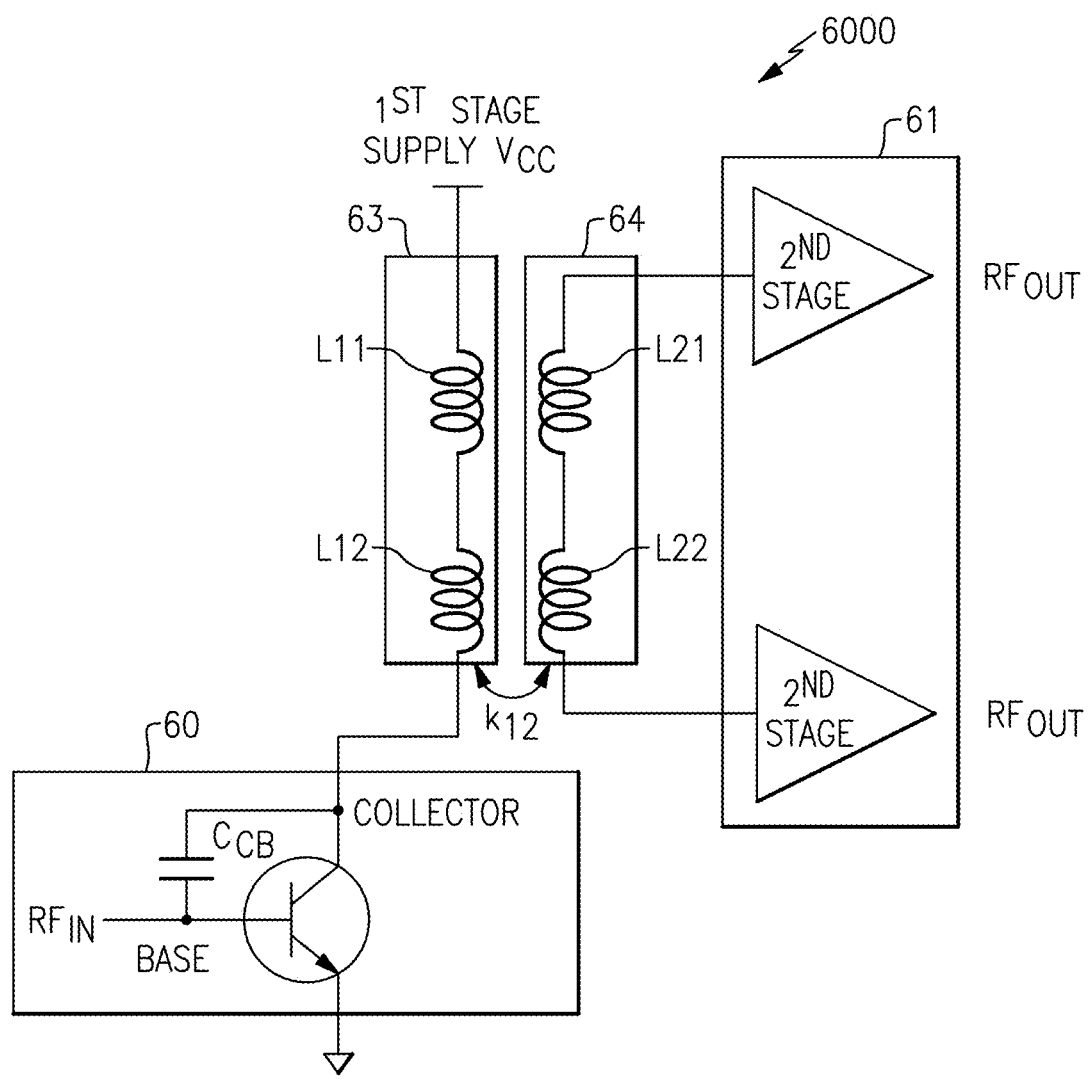
FIG. 6 shows an example of a circuit realization of the 2-stage conventional power amplifier shown in FIG. 4 and FIG. 5.

FIG. 6 shows a typical circuit realization of the power amplifier 5000 shown in FIG. 4 and FIG. 5. Typically, the power amplifier 6000 in FIG. 6 has a first amplification stage 60 including a bipolar transistor T1 having a base, a collector, and an emitter. The second amplification stage 61 has two separate amplification units (denoted as "2nd stage" which respectively output a differential signal $RF_{OUT}$ at the two outputs. The coupling units 63 and 64 are realized by coils L11, L12 in the first coupling unit 63 and by coils L21, L22 in the second coupling unit 64. Whilst two coils are respective indicated in the first and second coupling units 63, 64, one coil per coupling unit 63 and 64 is also possible. As indicated, the first coupling unit 63 and the second coupling unit 64 are inductively coupled through an inductive coupling with coupling coefficient $k_{12}$. The first coupling unit 63 is coupled between a first stage supply voltage $V_{CC}$ terminal and the collector of the bipolar transistor T1 of the first amplification stage 60. The second coupling unit 64 is coupled at a respective end to a respective second stage amplifier portion in the second amplification stage 61. Hence, this circuit arrangement provides a two-stage amplification and converts the single-ended RF input signal $RF_{IN}$ into a differential signal $RF_{OUT}$ (that is into an amplified differential signal).

Figure 7A:
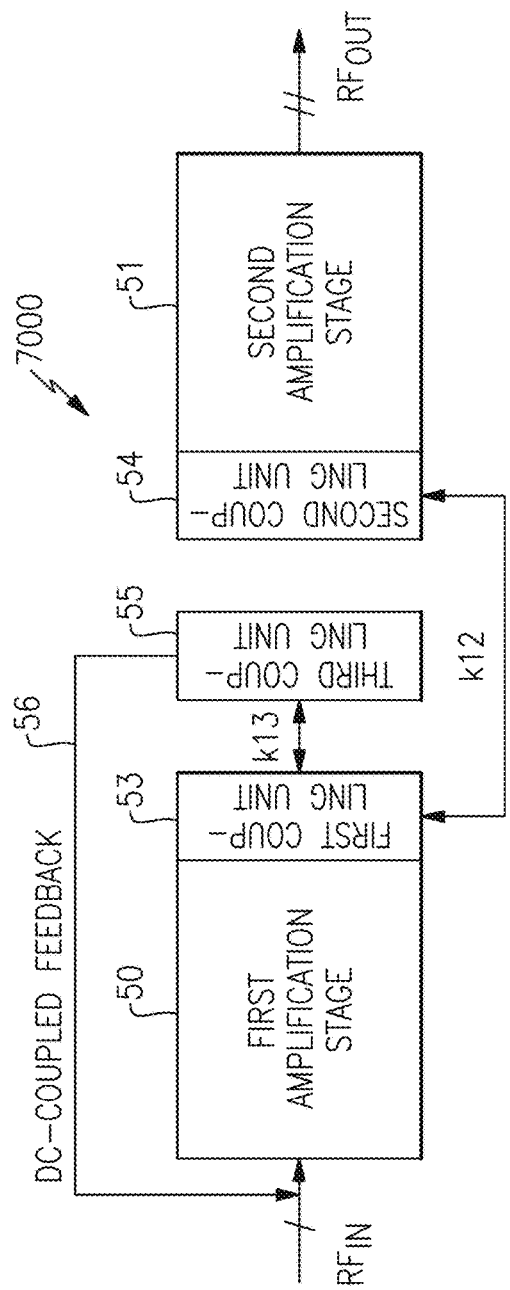
FIG. 7A shows a two-stage power amplifier usable in the mobile device shown in FIG. 1 with DC-coupled feedback to boost gain.
Figure 8A:
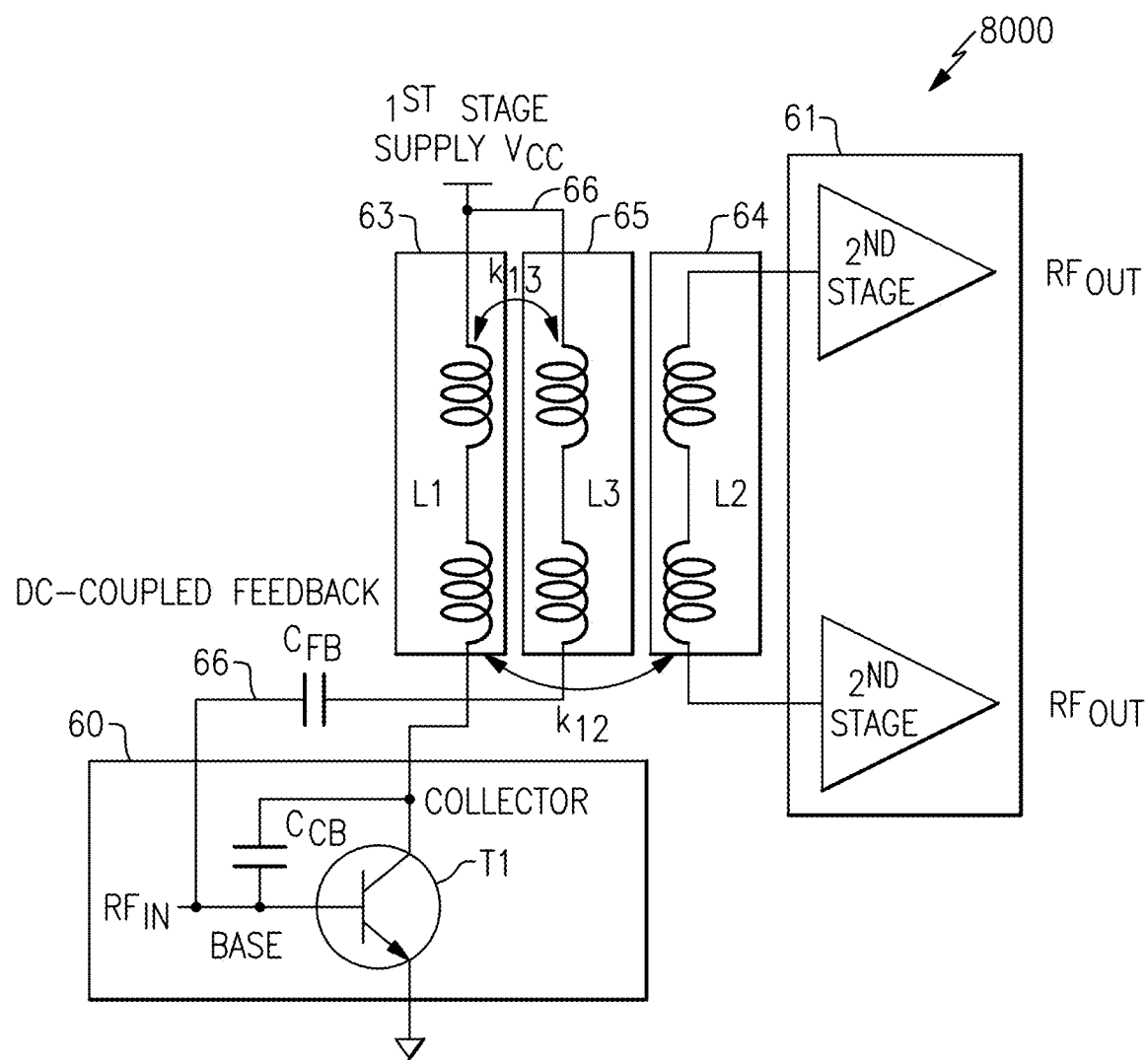
FIG. 8A shows a circuit implementation of the 2-stage power amplifier shown in FIG. 7A.

It is possible, in the circuit configuration of FIG. 5 (and in the circuit realization in FIG. 6) to increase the gain by a technique called "DC-coupled feedback". FIG. 7A indicates such a DC-coupled feedback with reference numeral 56 and FIG. 8A shows a circuit realization similar to FIG. 6. The power amplifier 7000 shown in FIG. 7A comprises only two amplification stages, namely a first amplification stage 50 and a second amplification stage 51. It also comprises, similarly as in FIG. 5, a first coupling unit 53, which is coupled to a second coupling unit 54 through a coupling coefficient k12. It receives a radio frequency (RF) input signal $RF_{IN}$ which is amplified by the two amplification stages 50, 51 into an amplified output signal $RF_{OUT}$. The power amplifier 7000 according to the FIG. 7A further comprises a third coupling unit 55 which is coupled to the first coupling unit 53 through a coupling coefficient k13. As shown in FIG. 7A, the third coupling unit 55 provides an DC feedback 55 to the input terminal of the first amplification stage 50 where the RF input signal $RF_{IN}$ is received. Similar to the design in FIG. 4 and FIG. 5, also the power amplifier 7000 in FIG. 7A has the first amplification stage 50 operating on single-ended signals whilst the second amplification stage 51 operates on differential signals. Therefore, the same reference numerals as in FIG. 4 and FIG. 5 are also used in FIG. 7A. Comparing the circuit realization of FIG. 6 with that of FIG. 8A, the additional third coupling unit 65 is realized by one or more coils L3 and one terminal of the third coupling unit 65 is connected to the base of the transistor T1 through a capacitor $C_{FB}$ and the other terminal of the third coupling unit (i.e. the third coil L3) is connected to the first stage power supply $V_{CC}$ terminal as indicated by reference numeral 66. Connecting the third coupling unit 65 in the manner shown in FIG. 8A, i.e. on terminal to the first stage power supply $V_{CC}$ terminal and the other terminal to the base of the transistor T1 through the capacitor $C_{FB}$, provides the "DC-coupled feedback" to boost the gain.

This DC-coupled feedback technique works to reduce the effective collector-based parasitic capacitance of the transistor (indicated with reference numeral $C_{CB}$ in FIG. 6 and FIG. 8A). However, as shown in FIG. 8A, this requires a direct DC-to-RF connection from the collector terminal to the base terminal of the transistor. Especially during the above described ET (envelope tracking) operation, such a connection can cause memory issues and prevent the power amplifier from supporting wide-band 5G modulations. As the collector terminal is modulated during ET operation, a direct DC-to-RF collector-to-base connection may cause issues that the low frequency (smaller than 100 megahertz)

modulated signal may corrupt the base signal. Such a corruption leads to memory effects in the power amplifiers, especially for a wide-band 100 MHz 5G modulations and appears as degraded adjacent-channel leakage ratio (ACLR) in the output spectrum of the amplified signal. Therefore, whilst the "DC-coupled feedback technique" has advantages in improving the power gain in 5G-NR power amplifier modules, care must be taken of the degradation and memory effects described above.

There are also other techniques for improving the power gain in 5G-NR power amplifier modules, for example, using a power amplifier design with more than two stages, for example, a three-stage power amplifier design. However, such a design using three amplification stages to achieve the desired power gain at 5G NR frequencies requires an additional die to accommodate the third stage and this may not be suitable for mobile devices and electronic devices targeted for price-sensitive markets. In addition, as already briefly mentioned above, including a third amplification stage requires additional battery current in the mobile device (in the order of 10-15 mA) and this increases the overall battery current consumption of a three-stage power amplifier module. Hence, whilst power amplifier designs with more stages (more than two stages) are useful in improving the power gain in 5G MR power amplifier modules, there is an issue regarding the additional battery current needed for such a design. The present invention addresses an alternative to the "DC-coupled feedback technique" and the "three-stage power amplifier design" solutions for boosting gain in power amplifiers, especially in ET-capable 5G power amplifier modules.

Figure 7B:
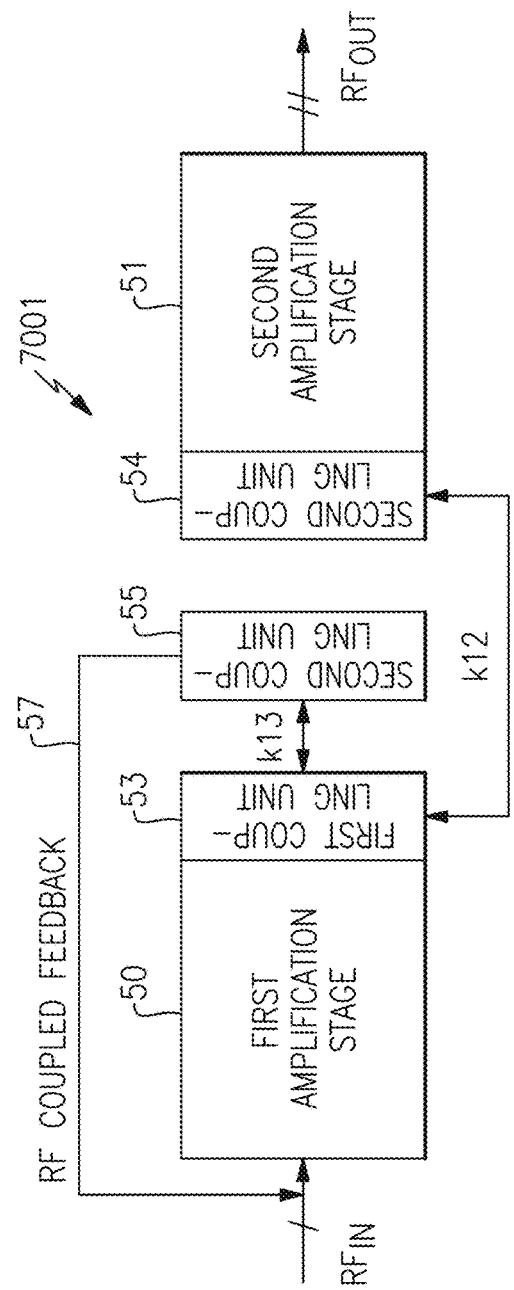
FIG. 7B shows an embodiment of a two-stage power amplifier usable in the mobile device shown in FIG. 1 with RF-coupled feedback.

FIG. 7B shows an embodiment of a 2-stage power amplifier according to the present invention. The power amplifier 7001 shown in FIG. 7B comprises two amplification stages, namely a first amplification stage 50 and a second amplification stage 51. It also comprises, similarly as in FIG. 7A, a first coupling unit 53, which is coupled to a second coupling unit 54 through a coupling coefficient k12. It receives a radio frequency (RF) input signal $RF_{IN}$ which is amplified by the two amplification stages 50, 51 into an amplified output signal $RF_{OUT}$. The power amplifier 7001 according to the embodiment in FIG. 7B further comprises the third coupling unit 55 which is coupled to the first coupling unit 53 through a coupling coefficient k13. As shown with reference numeral 57 in FIG. 7B, the third coupling unit 55 provides an RF-coupled feedback 57 to the input terminal of the first amplification stage 50 where the RF input signal $RF_{IN}$ is received. Similar to the design in FIG. 4 and FIG. 5 and FIG. 7A, also the power amplifier 7001 in FIG. 7A has the first amplification stage 50 operating on single-ended signals whilst the second amplification stage 51 operates on differential signals. Therefore, the same reference numerals as in FIG. 4 and FIG. 5 and FIG. 7A are also used in FIG. 7B.

Hence, the embodiment of the power amplifier module in FIG. 7B essentially uses an RF-coupled feedback technique to boost the gain, especially when used in an ET-capable 5G power amplifier. This technique may be seen as a further improvement of the above discussed "DC-coupled feedback technique" to increase gain.

Method for Boosting Gain in Multistage Power Amplifiers

Figure 7C:
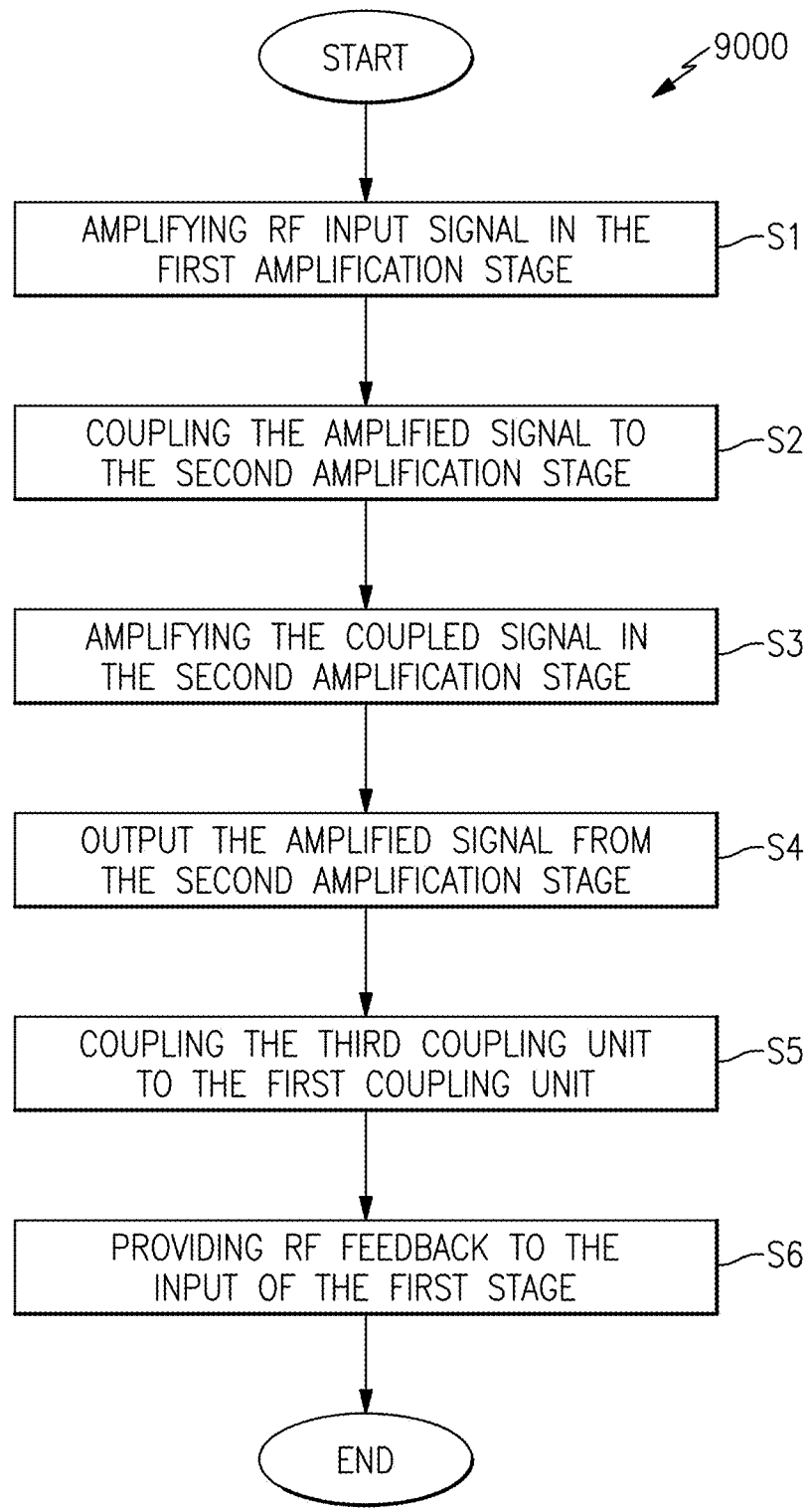
FIG. 7C shows an embodiment of a method for boosting gain in a 2-stage power amplifier.

FIG. 7C shows a flow chart 9000 of a method for boosting gain in a 2-stage power amplifier using the 2-stage amplifier design of FIG. 7B. The method 7000 in FIG. 7C for boosting gain in a 2-stage power amplifier comprises a step S1 of amplifying a radio frequency (RF) signal by a first amplification stage 60 having an input terminal for receiving the radio frequency (RF) signal $RF_{IN}$ and having a first coupling unit 63. Then, the radio frequency signal amplified by the first amplification stage 50 is coupled by the first coupling unit 53 to the second coupling unit 54 of the second amplification stage 51 in step S2. This is followed by a step S3 of amplifying the amplified signal coupled to the second coupling unit 54 by the second amplification stage 61 and a step S4 of outputting the amplified signal from the second amplification stage 61. The method 9000 also comprises coupling the third coupling unit 55 to the first coupling unit 53 in step S5 and, in step S6, providing RF feedback to the input terminal of the first amplification stage 50 through the RF feedback path 57 from the third coupling unit to 55 which is coupled to the first coupling unit 53.

Figure 8B:
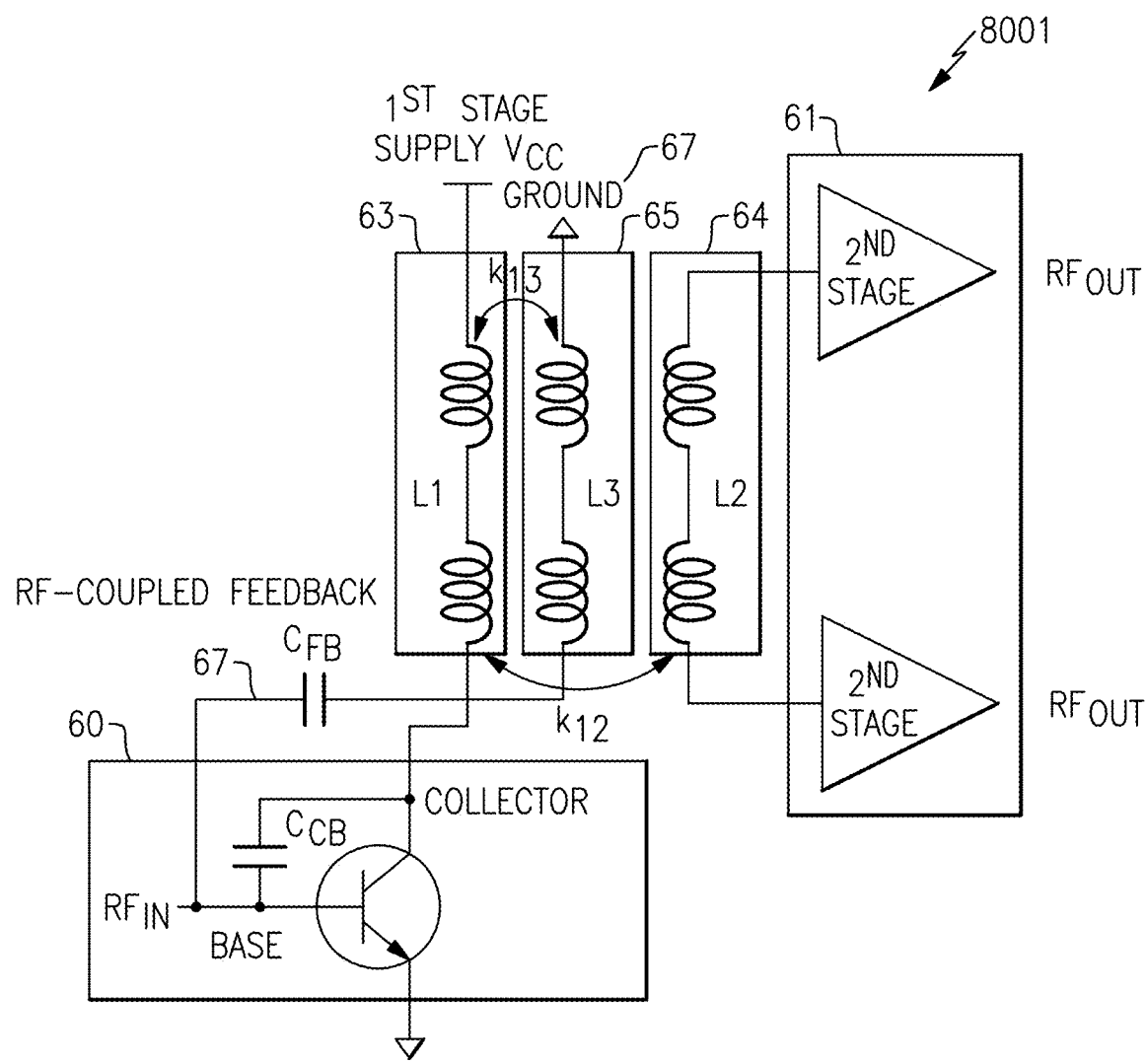
FIG. 8B shows an embodiment of a circuit implementation of the 2-stage power amplifier shown in FIG. 7B.

FIG. 8B shows an embodiment of a detailed circuit construction of a 2-stage power amplifier 8001 shown with the principal block diagram in FIG. 7B. The embodiment of the power amplifier 8001 comprises a first amplification stage 60 realized by a bipolar transistor T1 having a base, a collector, and an emitter. Also shown is a collector-base capacitance $C_{CB}$ between the collector and the base of the bipolar transistor T1. The first amplification stage 60 of the power amplifier 8001 receives the RF input signal $RF_{IN}$ and similarly as the power amplifier 6000 in FIG. 6, the second amplification stage 61 operates on differential signals and comprises, similarly as the design in FIG. 6, a first amplifier portion and a second amplifier portion, each indicated with "2nd stage" in the second amplification stage 61 and operating in a push-pull relationship.

The first coupling unit 63 corresponding to the first coupling unit 53 in FIG. 7B is realized by one or more coils L1 and the second coupling unit 64 is realized by one or more coils L2. At least one coil is required per coupling unit, however, several coils can be used. The first coupling unit 63 and the second coupling unit 64 are inductively coupled with a coupling coefficient k12. Above the first coupling unit 63, a first stage power supply voltage $V_{CC}$ terminal is shown, and the coil L1 of the first coupling unit 63 is coupled between this power supply terminal and the collector terminal of the bipolar transistor T1. According to the embodiment of the power amplifier 8001, there is a third coupling unit 65 comprising one or more coils L3. The third coupling unit 65 is shielded from the second coupling unit 64, i.e. it is only coupled inductively to the first coupling unit 63 coil L1. The third coupling unit 65 provides RF-coupled feedback through a feedback capacitor $C_{FB}$ to the base terminal of the transistor T1. The other end of the third coupling unit 65, that is the other end of the coil L3, is connected to a ground terminal. Since L3 is AC-shorted to ground at the ground terminal, the third coupling unit 65 provides RF-coupled feedback to the base of the transistor T1 as indicated with reference numeral 67.

The first coupling unit 63 and the third coupling unit 65 are coupled through inductive or RF coupling with a coupling coefficient k13. Otherwise, the operation of the two-stage amplification is similar to that in FIG. 6, that is, the first and second coupling units 63, and 64 form an inter-stage balun between the first and the second amplification stage 60, 61 to convert a single-ended first amplification stage signal into a differential signal to drive the second amplification stage 61 in a push-pull configuration with the two amplifier portions denoted as "$2^{nd}$ stage". Whilst the first capacitor CCB provided between the collector and the base of the bipolar transistor may be constituted of the intrinsic base-collector capacitance of the transistor T1 itself, also an additional collector-base capacitor may be present between the collector and the base of the bipolar transistor. In the RF feedback line also indicated with reference numeral 67, the second capacitor $C_{FB}$ is provided between the third coupling unit 55 and the base of the bipolar transistor T1 to provide the RF-coupled feedback. Furthermore, the inter-stage balun may be an on-die balun for converting the single ended first stage signal into the differential signal in the push-pull second amplification stage 61 when an implementation of on a die is desired.

Operation and Effects of Multistage Amplifier Design with RF-Coupled Feedback

As explained above, the embodiments of the invention propose adding a third coil network L3 to the inter-stage balun L1, L2 that is RF-coupled to the primary coil L1 (FIG. 8A). One terminal of this third coil network L3 is grounded, while the other end is connected to the base of the first stage transistor T1. The third coil network L3 includes a series capacitor $C_{FB}$ that is used to cancel/neutralize the parasitic collector-to-base device capacitor $C_{CB}$ of the bipolar transistor T1.

The operation and effects of this 2-stage power amplifier 8000 are as follows. The inter-stage balun 63, L1; 64, L2 takes the collector signal of the first amplification stage 60 and creates in-phase/out-phase signals to drive the push-pull second amplification stage 61. The third coil L3 in the inter-stage balun 55 is RF coupled to the primary coil L1 of the first coupling unit 63 and is connected to ground. As a result, the signal at one end of the capacitor $C_{FB}$ in the third coil L3 is 180° out-of-phase with the collector terminal of the bipolar transistor T1 of the first amplification stage (FIG. 8B). The other end of the capacitor $C_{FB}$ is connected to the base terminal of the bipolar transistor T1. This signal configuration across the terminal of the capacitor $C_{FB}$ results in the feedback capacitance of the capacitor $C_{FB}$ to be at least partially subtracted from the parasitic collector-to-base $C_{CB}$ capacitance.

Figure 10:
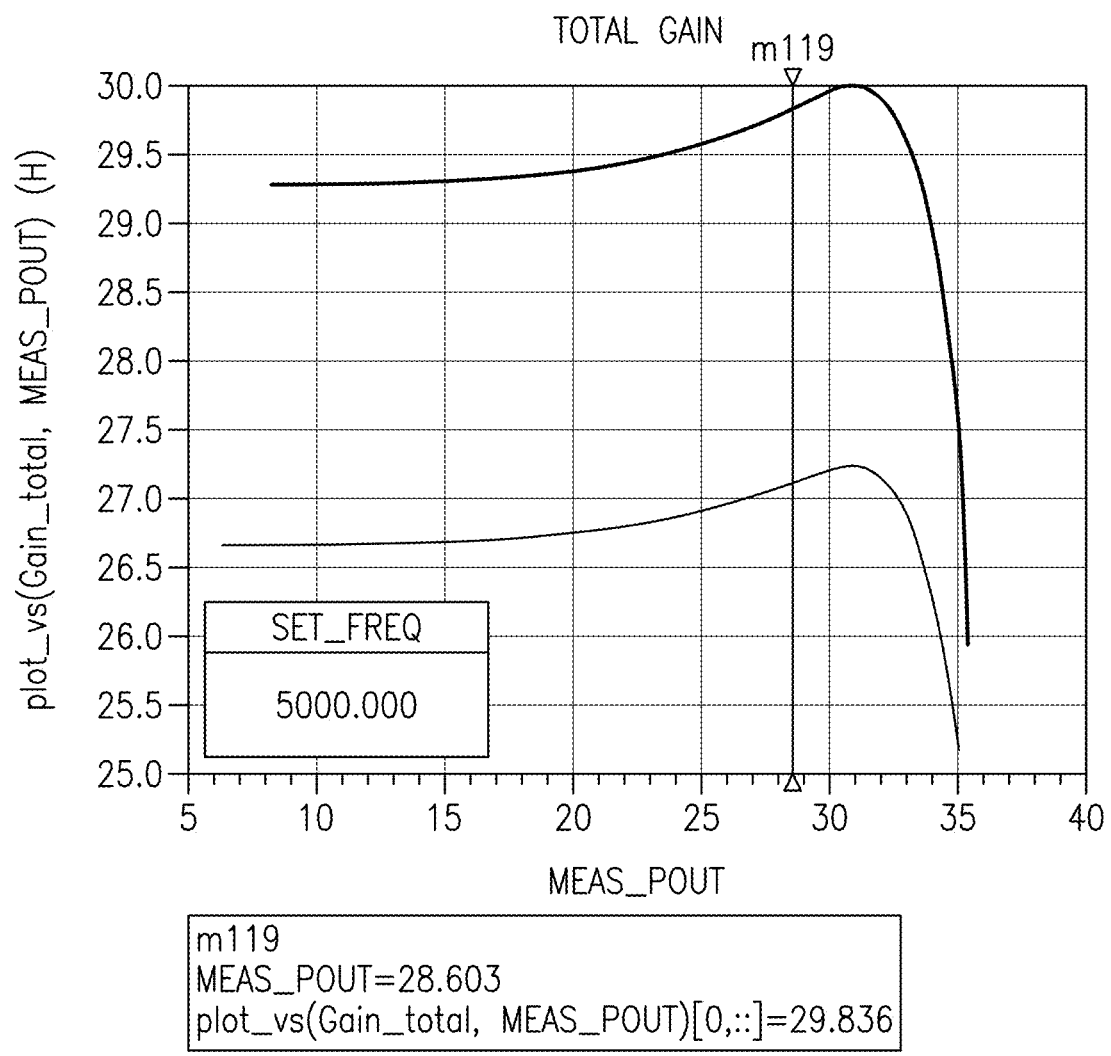
FIG. 10 shows the simulated CW (continuous wave) gain improvement using the RF-coupled feedback by the third coupling unit.
Figure 11A:
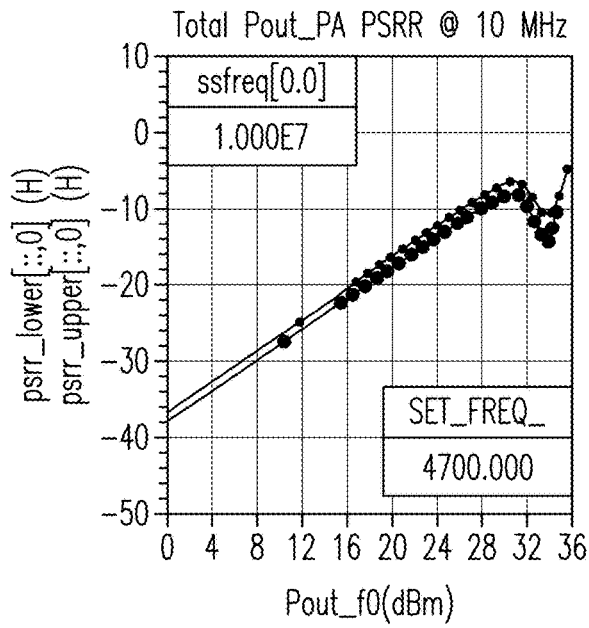
FIGS. 11A-11I show plots for different examples of simulations showing simulated PSSR using the RF-coupled feedback by the third coupling unit.
Figure 11B:
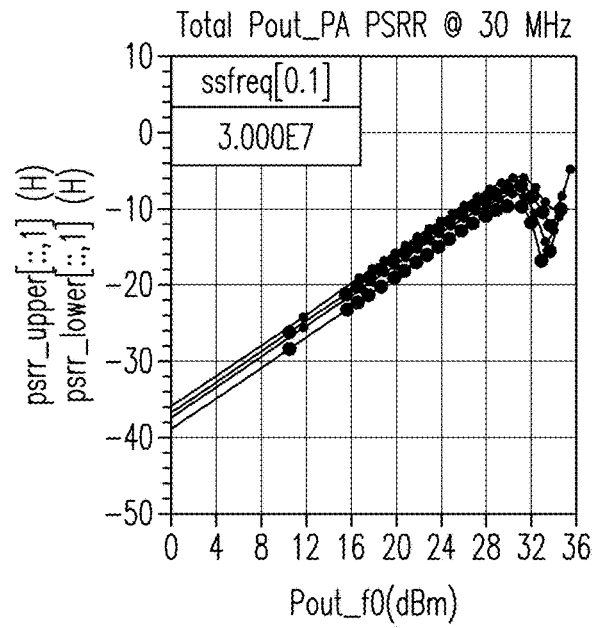
Figure 11C:
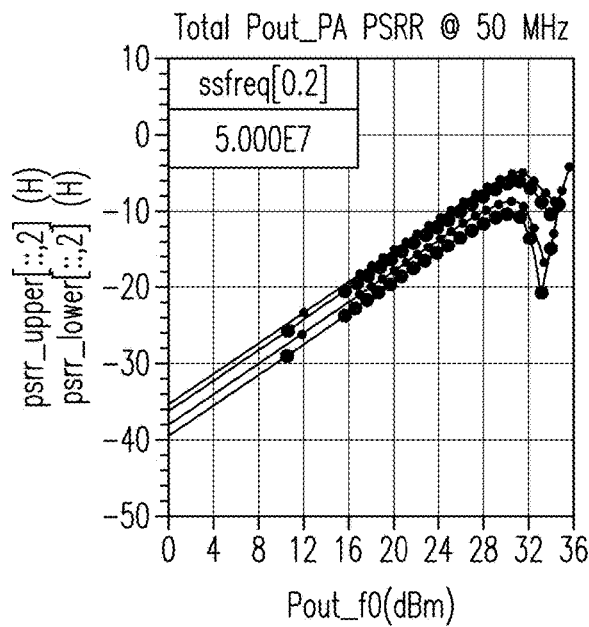
Figure 11D:
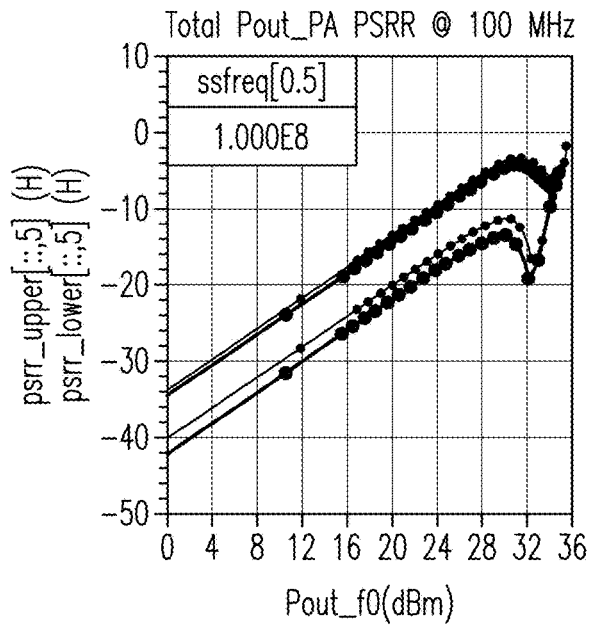
Figure 11E:
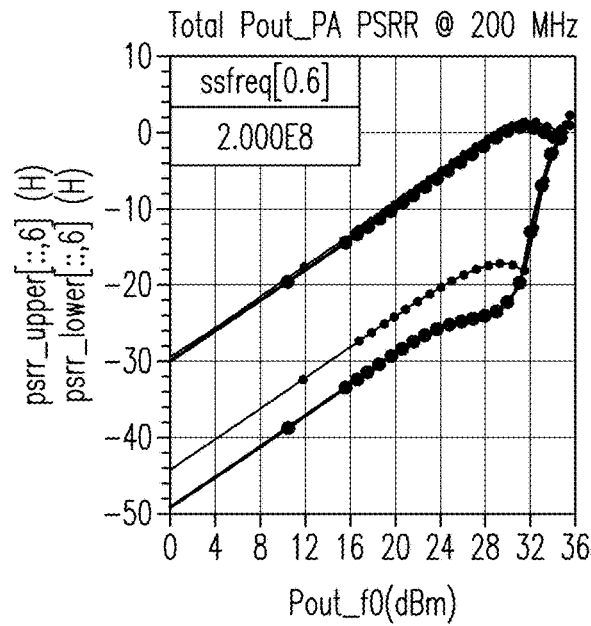
Figure 11F:
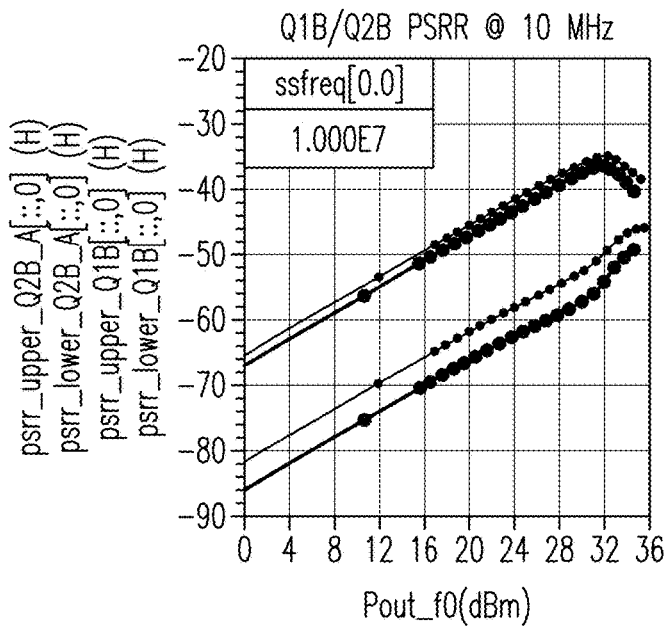
Figure 11G:
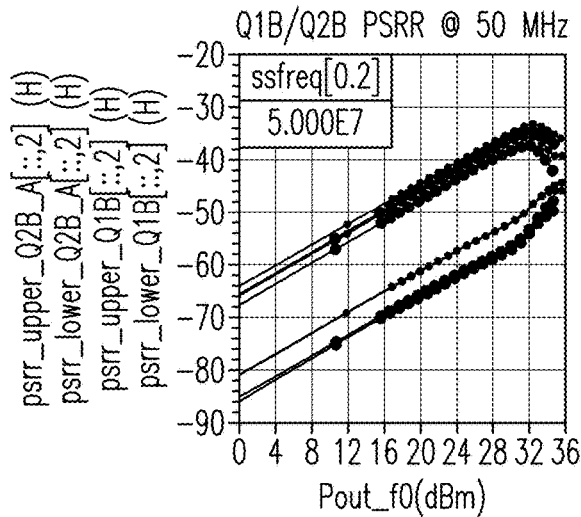
Figure 11H:
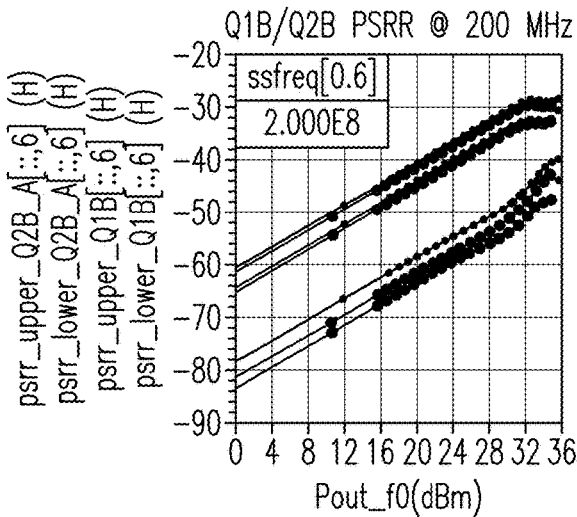
Figure 11I:
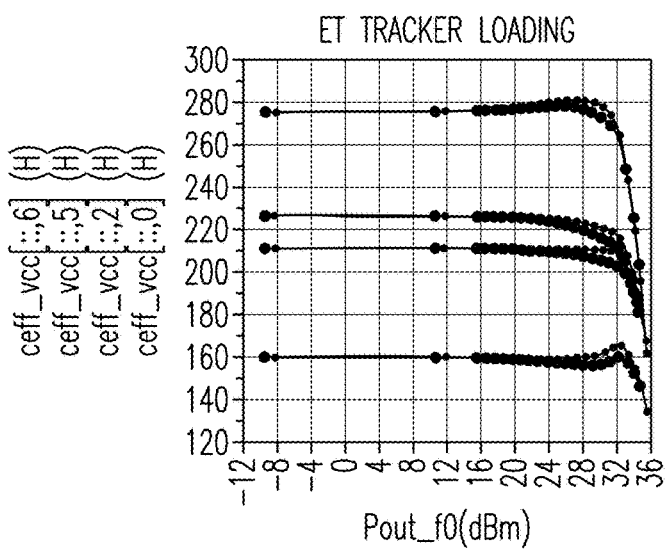

Partial cancellation of the parasitic capacitance $C_{CB}$ increases the power gain from the first amplification stage 60 of the power amplifier 8001 approx. 2 dB-3 dB at 5 GHz Tx (transmitter of RF) frequency, as shown in the example of FIG. 10.

The signal coupling from the primary coil L1 of the first coupling unit 63 to the third coil L3 of the third coupling unit 65 is frequency dependent. The coupling is optimized for the Tx frequency bands to maximize the gain improvement by $C_{CB}$ cancellation. Since, the coupling is inductive in nature, the low frequency base-band modulated envelope (<100 MHz) cannot couple to the third coil L3. Thus, even under ET (envelope tracking) operation, when the collector of the bipolar transistor T1 of the first amplification stage 60 is modulated at base-band frequencies (see the envelope tracking embodiments below in FIG. 13 and FIG. 14), there is no base-band signal in the third coil L3. This prevents the base-band signal from reaching the base terminal of the bipolar transistor T1 of the first amplification stage 60 and causing memory issues in the power amplifier 8000. This is validated by running a PSRR simulation which shows no degradation in signal rejection using the RF feedback technique with the third coupling unit 55 compared to the baseline (see the examples a)-i) in FIG. 11) for wide-band modulated signals.

Figure 12B:
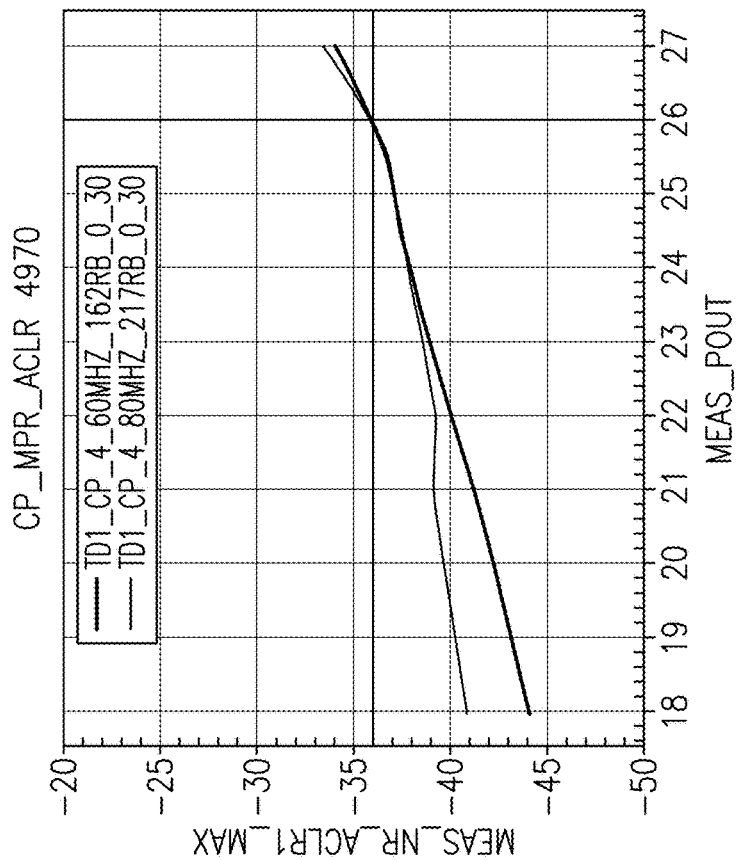
FIGS. 12A-12B show data of the two-stage 5G-NR power amplifier design using the proposed RF-coupled feedback technique by the third coupling unit, where
Figure 12A:
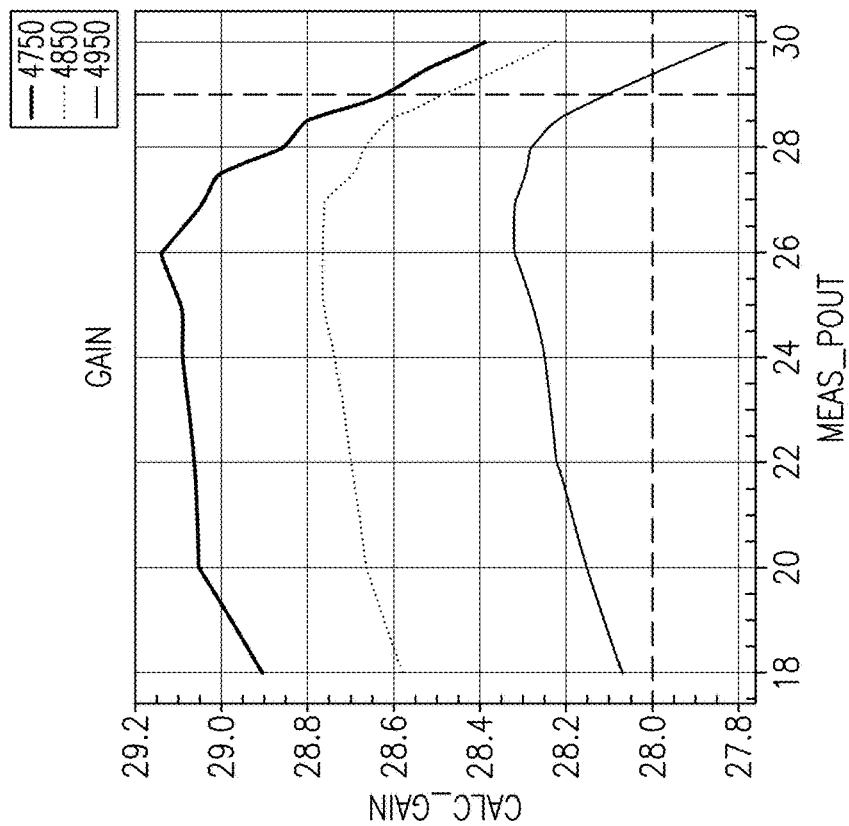

The functionality of this using the RF feedback technique as indicated with reference numeral 67 in FIG. 8B with the third coupling unit 55, both in terms of gain improvement as well as supporting 5G modulation under ET mode of operation has been validated by simulation and lab measurements as shown in the examples a)-i) in FIG. 11. FIG. 12 shows lab data of the two-stage 5G-NR power amplifier design using the proposed RF-coupled feedback technique by the third coupling unit 65, 67, where FIG. 12 (a) shows the modulated gain meeting a desired specification of 28 dB at 5 GHz and where (b) shows the results for a 60 MHz and 80 MHz ET (envelope tracking) operation.

Summarizing, the 2-stage power amplifier 8001 of the embodiment of FIG. 8B and the method for amplification according to the embodiment of FIG. 7C can boost the gain in 2-stage power amplifiers, that is they contribute to achieve a desired large signal power gain especially at 5G NR frequencies using a two-stage power amplifier design. Compared to the above described alternative three-stage power amplifier design, the proposed technique can also achieve the desired gain using a smaller die area, enabling the overall power amplifier module to be both cheaper (due to die cost reduction) and more compact (due to die size reduction). The power amplifier 8001 according to the embodiment, therefore, also saves the 10-15 mA battery current required in a three-stage design.

Furthermore, in contrast to a gain boosting method with the "DC-coupled feedback technique" (FIG. 7A, 8A) with its limitations of memory effects in ET mode, due to baseband signal corruption at the transistor base terminal, by using a RF coupling technique for gain boosting in the power amplifier 8001 of the embodiment, the power amplifier 8001 can be used for both APT (Average Power Tracking) and ET (envelope Tracking) for wide-band 5G modulations. This allows the power amplifier module to be used in a wider range of applications and some of these applications are described hereinafter with reference to FIGS. 13A, 13B, 14 and FIGS. 15A, 15B and FIG. 16 describe a die implementation.

RF-Coupled Layout Implementation

Figure 9:
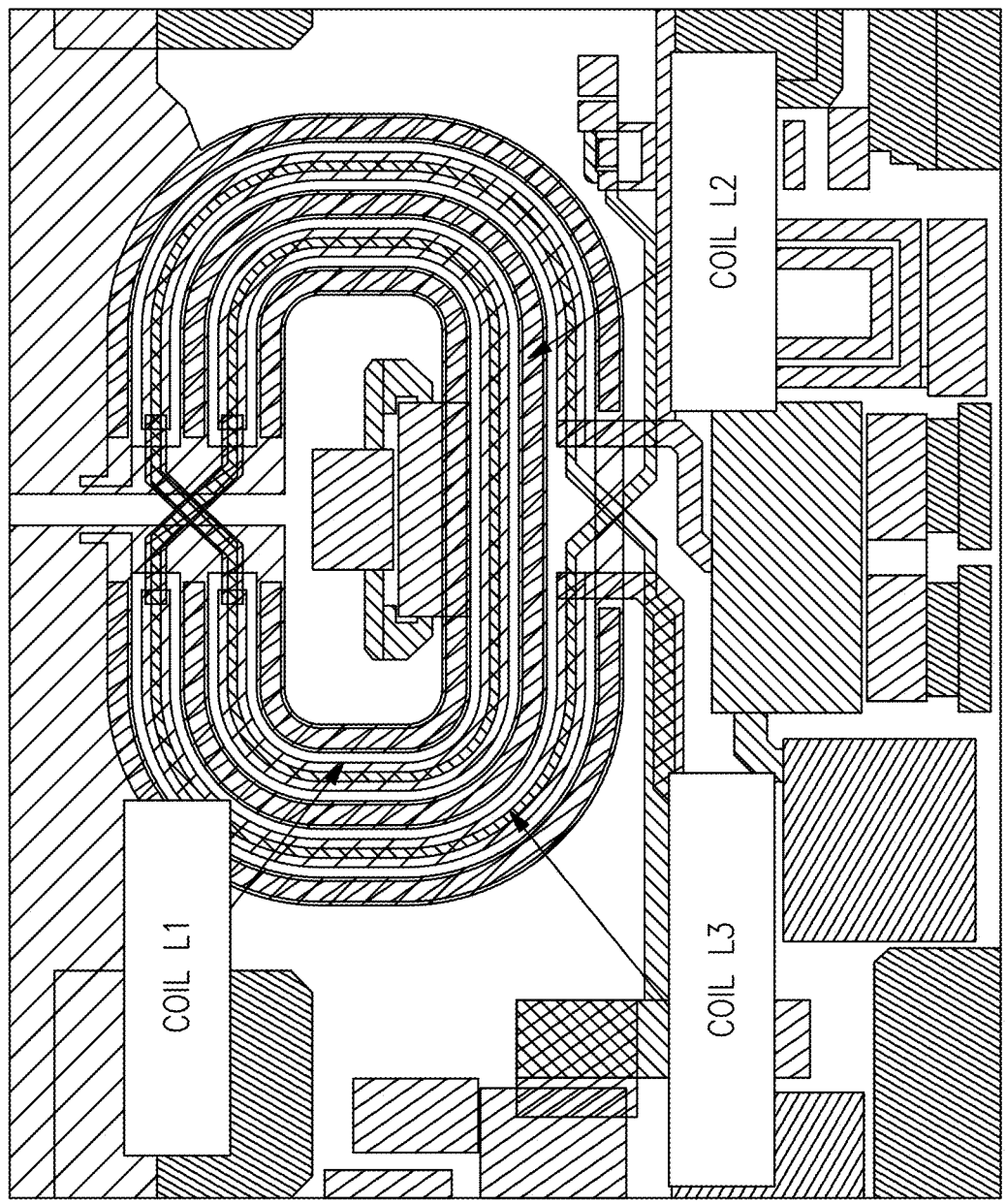
FIG. 9 shows a chip implementation of the third coupling unit shown in FIGS. 7 and 8.

A layout implementation of the proposed RF-coupled feedback 2-stage power amplifier is shown in the insert in FIG. 9. The two crossed portions "X" indicate the reverse coupling of the first and third coupling units 63, 65 because this reverse coupling along with the connection of the first coil L1 to the power supply terminal $V_{CC}$ and the third coil L3 being connected to ground, cause the signal at one end of the capacitor $C_{FB}$ in the third coil L3 to be 180° out-of-phase with signal at the collector terminal of the bipolar transistor T1 of the first amplification stage (FIG. 8B) resulting in the cancellation effect of the base-collector capacitance $C_{CB}$ when the feedback capacitor $C_{FB}$ is provided.

In more detail, the following is shown in the layout implementation in FIG. 9. Essentially, the implementation of the RF coupled feedback concept is realized in a planar integrated circuit technology in the following manner. The primary coil on the $1^{st}$ stage driver circuit (the first amplification stage) is labelled as COIL L1, the secondary coil on the differential $2^{nd}$ stage (the second amplification stage) is labelled as COIL L2 and the RF coupled feedback (third coupling unit) is labelled as COIL L3. COIL L3 is strongly coupled to COIL L1 by routing it completely under COIL L1. This is needed to perform the RF coupled feedback functionality. COIL L3 is also shielded from undesired coupling from COIL L2 by routing it under COIL L1. In addition the width of COIL L3 is made narrow and completely under COIL L1 to prevent any lateral coupling to COIL L2.

One-Stage Power Amplifier Design with RF-Coupled Feedback

The embodiment and the effects of the 2-stage power amplifier design with RF-coupled feedback according to the invention have been explained above with reference to FIG.

7B and FIG. 8B. However, it should be noted that the effects occur primarily in the first amplification stage 50, 60 with the first and third coupling units 53, 63; 55, 65 providing the RF-coupled feedback causing the at least partial cancellation of the parasitic capacitance $C_{CB}$ to increase the power gain from the first amplification stage 50, 60 of the power amplifier 7001/8001. Therefore, the invention can also be applied to a single-stage power amplifier design with only one amplification stage or to several such first stage amplifier designs cascaded in series followed or not followed by a second stage differential signal amplification stage.

Applications of Multistage Power Amplifier Design with Rf Feedback

Having described the principal operation of the power amplifier 800 and 7001 according to the embodiments of the invention, hereinafter, the application of the 2-stage power amplifiers in an envelope tracking system is described.

Figure 13A:
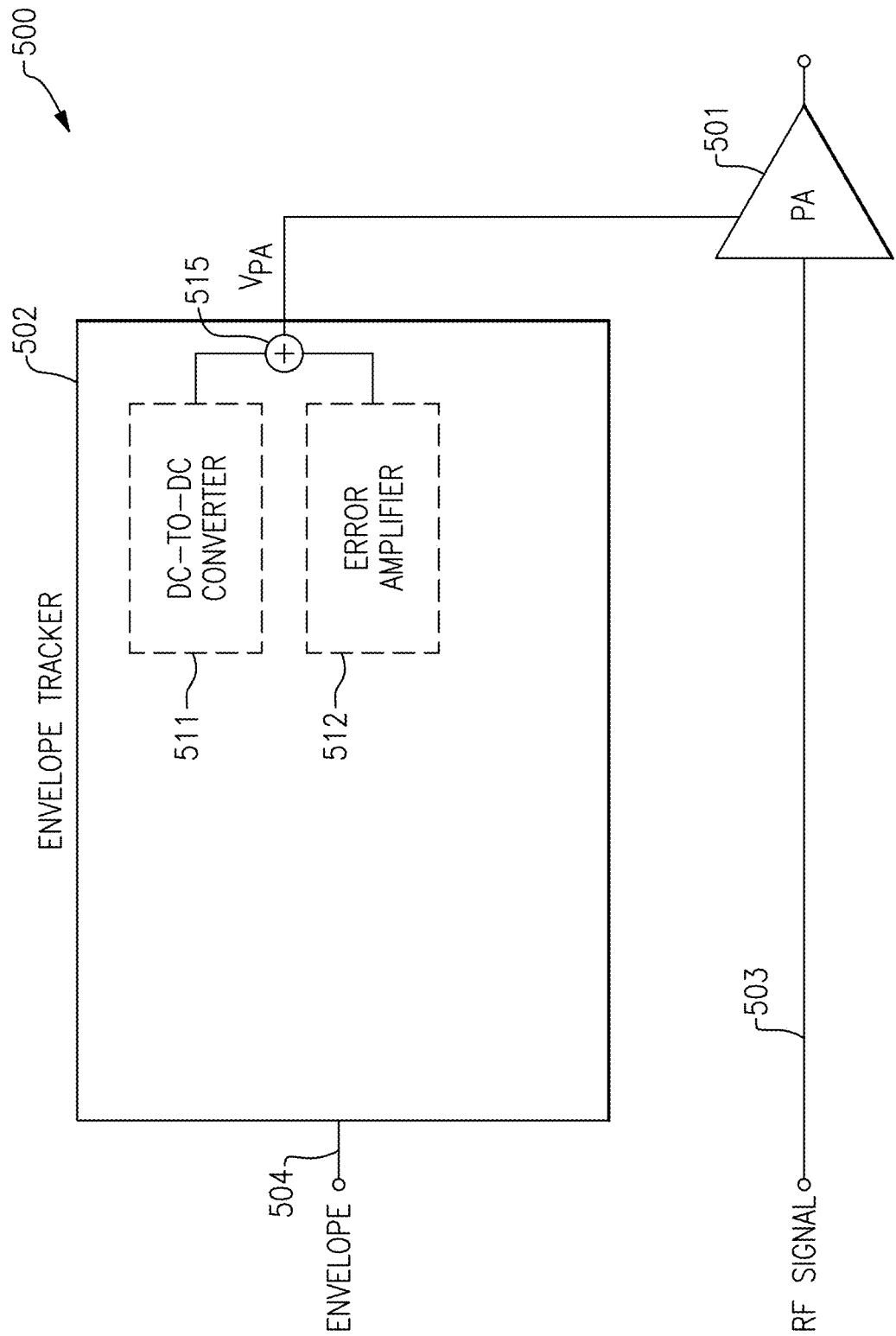
FIG. 13A is a schematic diagram of an envelope tracking system according to one embodiment.

FIG. 13A is a schematic diagram of an envelope tracking system 500 according to one embodiment. The envelope tracking system 500 includes a power amplifier 501 and an envelope tracker 502. The power amplifier 501 provides amplification to a radio frequency signal 503.

The envelope tracker 502 receives an envelope signal 504 corresponding to an envelope of the radio frequency signal 503. Additionally, the envelope tracker 502 generates a power amplifier supply voltage $V_{PA}$, which supplies power to the power amplifier 501.

The illustrated envelope tracker 502 includes a DC-to-DC converter 511 and an error amplifier 512 that operate in combination with one another to generate the power amplifier supply voltage $V_{PA}$ based on the envelope signal 504. In the illustrated embodiment, an output of the DC-to-DC converter 511 and an output of the error amplifier 512 are combined using a combiner 515.

The envelope tracker 502 of FIG. 13A illustrates one example of analog envelope tracking, in which a switching regulator operate in parallel with one another to track an envelope of an RF signal.

Figure 13B:
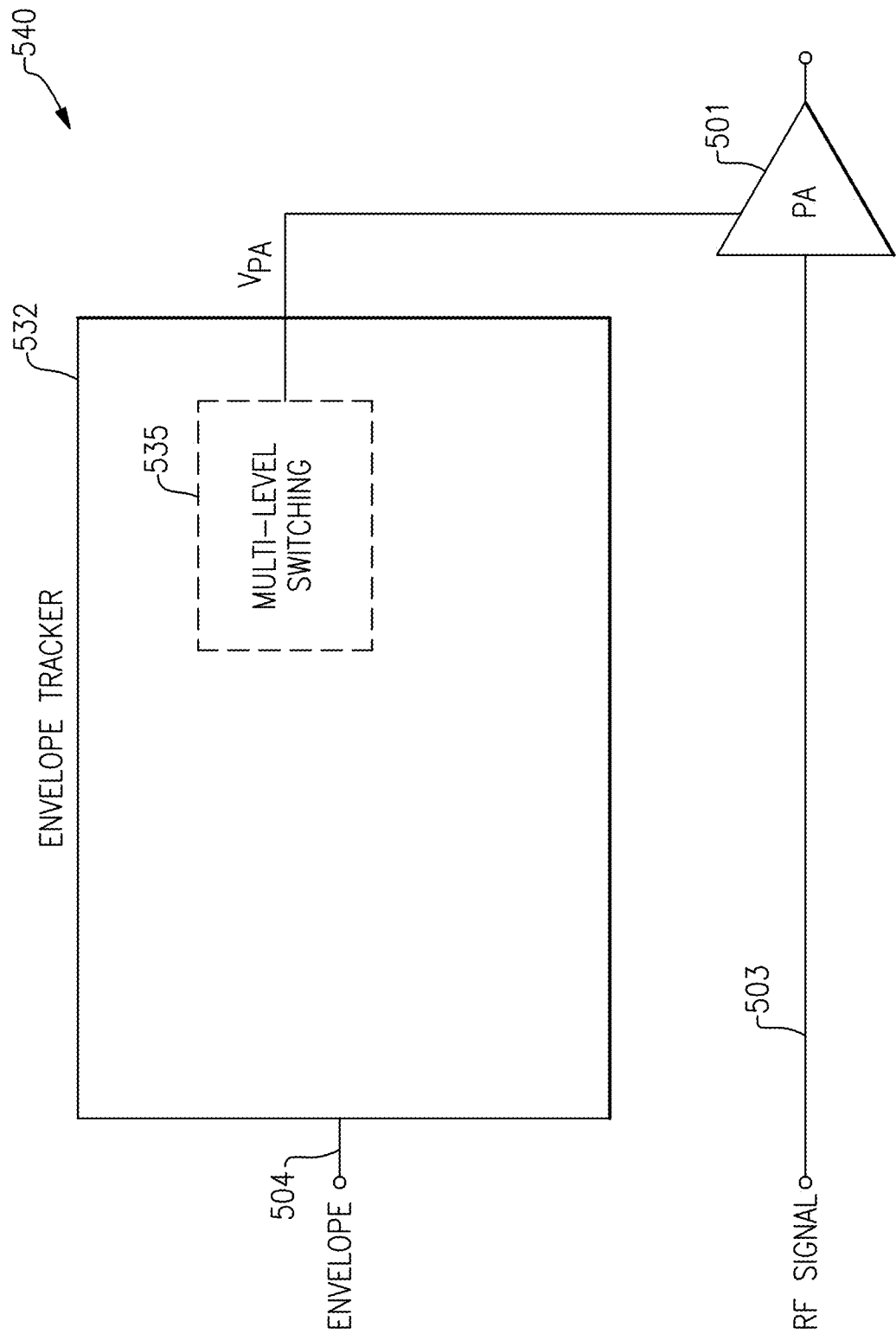
FIG. 13B is a schematic diagram of an envelope tracking system according to another embodiment.

FIG. 13B is a schematic diagram of an envelope tracking system 540 according to another embodiment. The envelope tracking system 540 includes a power amplifier 501 and an envelope tracker 532. The power amplifier 501 provides amplification to a radio frequency signal 503.

The envelope tracker 532 receives an envelope signal 504 corresponding to an envelope of the radio frequency signal 503. Additionally, the envelope tracker 532 generates a power amplifier supply voltage $V_{PA}$, which supplies power to the power amplifier 501.

The illustrated envelope tracker 532 includes a multi-level switching circuit 535. In certain implementations, the multi-level switching circuit includes a multi-output DC-to-DC converter for generating regulated voltages of different voltage levels, switches for controlling selection of a suitable regulated voltage over time based on the envelope signal, and a filter for filtering the output of the switches to generate the power amplifier supply voltage.

The envelope tracker 532 of FIG. 13B illustrates one example of MLS envelope tracking.

Figure 14:
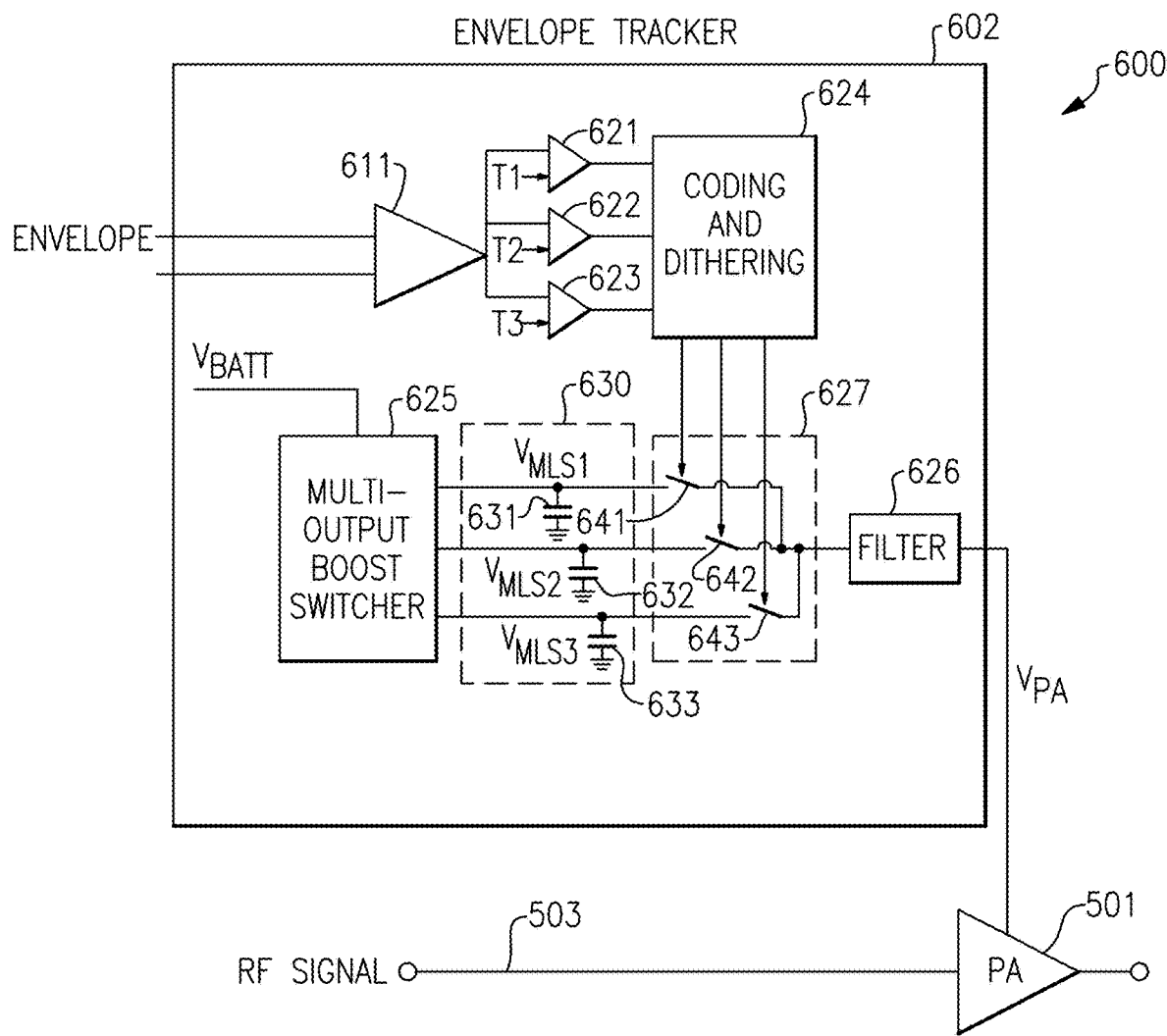
FIG. 14 is a schematic diagram of an envelope tracking system according to another embodiment.

FIG. 14 is a schematic diagram of an envelope tracking system 600 according to another embodiment. The envelope tracking system 600 includes a power amplifier 501 and an envelope tracker 602. The power amplifier 501 provides amplification to a radio frequency signal 503.

The envelope tracker 602 receives an envelope signal corresponding to an envelope of the radio frequency signal 503. In this example, the envelope signal is differential.

Additionally, the envelope tracker 602 generates a power amplifier supply voltage $V_{PA}$, which supplies power to the power amplifier 501.

The illustrated envelope tracker 602 includes an envelope amplifier 611, a first comparator 621, a second comparator 622, a third comparator 623, a coding and dithering circuit 624, a multi-output boost switcher 625, a filter 626, a switch bank 627, and a capacitor bank 630. The capacitor bank 630 includes a first capacitor 631, a second capacitor 632, and a third capacitor 633. Additionally, the switch bank 627 includes a first switch 641, a second switch 642, and a third switch 643.

The envelope amplifier 611 amplifies the envelope signal to provide an amplified envelope signal to the first to third comparators 621-623. The first to third comparators 621-623 compare the amplified envelope signal to a first threshold T1, a second threshold T2, and a third threshold T3, respectively. The results of the comparisons are provided to the coding and dithering circuit 624, which processes the results to control selection of switches of the switch bank 627. The coding and dithering circuit 624 can activate the switches while using coding and/or dithering to reduce artifacts arising from opening and closing the switches.

Although an example with three comparators is shown, more or fewer comparators can be used. Furthermore, the coding and dithering circuit 624 can be omitted in favor of controlling the switch bank in other ways. In a first example, coding but not dithering is used. In a second example, dithering but not coding is used. In a third example, neither coding nor dithering is used.

The multi-output boost switcher 625 generates a first regulated voltage $V_{MLS1}$, a second regulated voltage $V_{MLS2}$, and a third regulated voltage $V_{MLS3}$ based on providing DC-to-DC conversion of a battery voltage $V_{BATT}$. Although an example with three regulated voltages is shown, the multi-output boost switcher 625 can generate more or fewer regulated voltages. In certain implementations, at least a portion of the regulated voltages are boosted relative to the battery voltage $V_{BATT}$. In some configurations, one or more of the regulated voltages is a buck voltage having a voltage lower than the battery voltage $V_{BATT}$.

The capacitor bank 630 aids in stabilizing the regulated voltages generated by the multi-output boost switcher 625. For example, the capacitors 631-633 operate as decoupling capacitors.

The filter 626 processes the output of the switch bank 627 to generate the power amplifier supply voltage $V_{PA}$. By controlling the selection of the switches 641-643 over time based on the envelope signal, the power amplifier supply voltage $V_{PA}$ is generated to track the envelope signal.

Figure 15A:
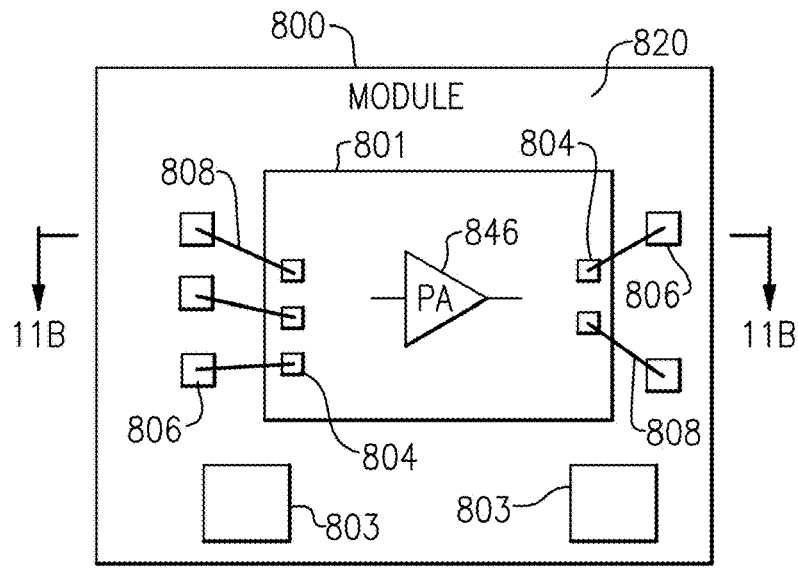
FIG. 15A is a schematic diagram of one embodiment of a packaged module.
Figure 15B:
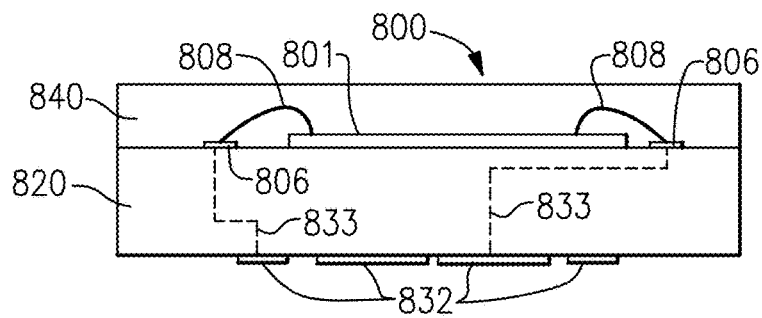
FIG. 15B is a schematic diagram of a cross-section of the packaged module of FIG. 15A taken along the lines 15B-15B.

FIG. 15A is a schematic diagram of one embodiment of a packaged module 800. FIG. 15B is a schematic diagram of a cross-section of the packaged module 800 of FIG. 15A taken along the lines 15B-15B.

The packaged module 800 includes an IC or die 801, surface mount components 803, wirebonds 808, a package substrate 820, and encapsulation structure 840. The package substrate 820 includes pads 806 formed from conductors disposed therein. Additionally, the die 801 includes pads 804, and the wirebonds 808 have been used to electrically connect the pads 804 of the die 801 to the pads 806 of the package substrate 801.

The die 801 includes a power amplifier 846, which can be implemented in accordance with any of the embodiments herein.

The packaging substrate 820 can be configured to receive a plurality of components such as the die 801 and the surface mount components 803, which can include, for example, surface mount capacitors and/or inductors.

As shown in FIG. 15B, the packaged module 800 is shown to include a plurality of contact pads 832 disposed on the side of the packaged module 800 opposite the side used to mount the die 801. Configuring the packaged module 800 in this manner can aid in connecting the packaged module 800 to a circuit board such as a phone board of a wireless device. The example contact pads 832 can be configured to provide RF signals, bias signals, power low voltage(s) and/or power high voltage(s) to the die 801 and/or the surface mount components 803. As shown in FIG. 15B, the electrically connections between the contact pads 832 and the die 801 can be facilitated by connections 833 through the package substrate 820. The connections 833 can represent electrical paths formed through the package substrate 820, such as connections associated with vias and conductors of a multilayer laminated package substrate.

In some embodiments, the packaged module 800 can also include one or more packaging structures to, for example, provide protection and/or facilitate handling of the packaged module 800. Such a packaging structure can include overmold or encapsulation structure 840 formed over the packaging substrate 820 and the components and die(s) disposed thereon.

It will be understood that although the packaged module 800 is described in the context of electrical connections based on wirebonds, one or more features of the present disclosure can also be implemented in other packaging configurations, including, for example, flip-chip configurations.

Figure 16:
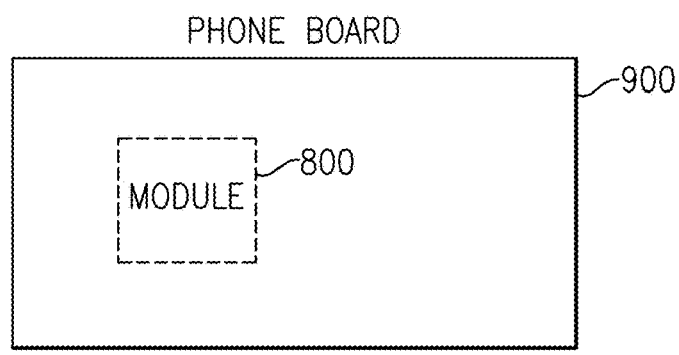
FIG. 16 is a schematic diagram of one embodiment of a phone board.

FIG. 16 is a schematic diagram of one embodiment of a phone board 900. The phone board 900 includes the module 800 shown in FIGS. 15A-15B attached thereto. Although not illustrated in FIG. 16 for clarity, the phone board 800 can include additional components and structures.

Method for Envelope Tracking Using Mulistage Power Amplifier with RF Feedback

Figure 17:
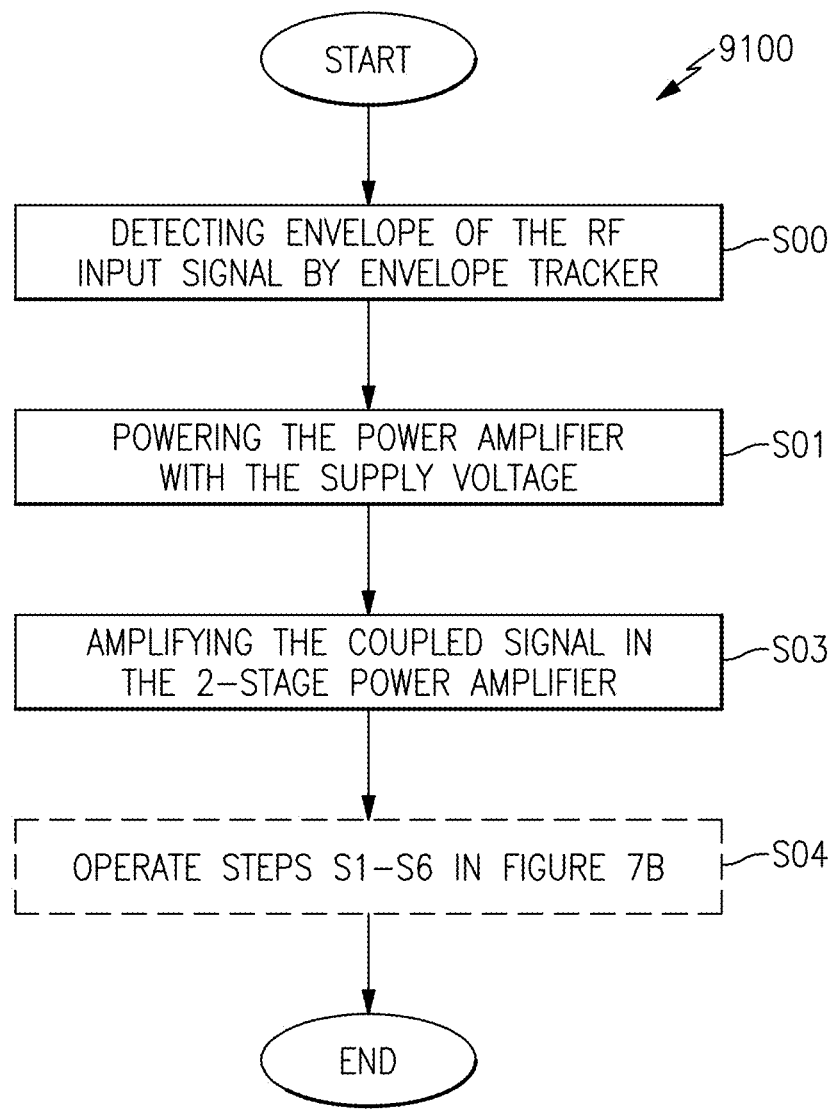
FIG. 17 is a flow chart of an amplification method using envelope tracking with the envelope tracking system shown in FIGS. 13A, 13B and 14.

FIG. 17 illustrates a flow chart of an amplification method 9100 using envelope tracking with the envelope tracking system shown in FIGS. 13A, 13B and 14. The method comprises step S00 of detecting the envelope of the RF input signal using the envelope tracker and step S01 of generating a power amplifier supply voltage that changes is relation to the envelope of a radio frequency input signal detected using the envelope tracker. Also in step S01, the power amplifier is powered using the generated power amplifier supply voltage. In step S03 the radio frequency signal is amplified using the power amplifier and this comprises, step S04, the carrying out of the steps S1-S6 of FIG. 7b. Thus, the envelope tracking system can advantageously employ the 2-stage power amplifiers with RF feedback according to the embodiments with all their advantages.

Other Applications

Some of the embodiments described above have provided examples in connection with wireless devices or mobile phones. However, the principles and advantages of the embodiments can be used for any other systems or apparatus that have needs for power amplifiers.

Such envelope trackers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Other Applications

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier comprising:
   a first amplification stage having an input terminal receiving a radio frequency signal to be amplified and having a first coupling unit on a die with a first width;
   a second amplification stage outputting an amplified radio frequency signal and having a second coupling unit on the die that is inductively coupled with the first coupling unit; and
   a third coupling unit on the die inductively coupled with the first coupling unit, the third coupling unit provides radio frequency-coupled feedback to the input terminal of the first amplification stage through a radio frequency-coupled feedback path, the third coupling unit is shielded from the second coupling unit by routing the third coupling unit completely under the first coupling unit with the third coupling unit having a second width that is narrower than the first width.

2. The power amplifier of claim 1 wherein the first, second and third coupling units respectively include at least one coil.

3. The power amplifier of claim 1 wherein the first amplification stage includes a bipolar transistor having a base, a collector, and an emitter.

4. The power amplifier of claim 1 wherein the second amplification stage includes two amplifier portions in push-pull arrangement.

5. The power amplifier of claim 4 wherein the second amplification stage operates on differential signals.

6. The power amplifier of claim 5 wherein the first amplification stage operates on single-ended signals.

7. The power amplifier of claim 6 wherein the first and second coupling units form an inter-stage balun between the first and second amplification stages to convert a single-ended first amplification stage signal into a differential signal to drive the second amplification stage.

8. The power amplifier of claim 3 further comprising a first stage power supply terminal and a ground terminal, the first coupling unit being connected between the first stage power supply terminal and the collector of the bipolar transistor.

9. The power amplifier of claim 8 wherein the third coupling unit is connected between the ground terminal and the base of the bipolar transistor.

10. The power amplifier of claim 9 further comprising a first capacitor and a second capacitor, the first capacitor being provided between the collector and the base of the bipolar transistor and the second capacitor being provided in the radio frequency-coupled feedback path between the third coupling unit and the base of the bipolar transistor.

11. The power amplifier according to claim 7 further comprising a die, the inter-stage balun being an on-die balun for converting the single-ended first amplification stage signal into the differential signal.

12. A method for boosting gain in a power amplifier, the method comprising:
    amplifying a radio frequency signal by a first amplification stage on a die having an input terminal for receiving the radio frequency signal and having a first coupling unit with a first width;
    inductively coupling on the die the first coupling unit with a second coupling unit of a second amplification stage;
    amplifying the amplified radio frequency signal with a second amplification stage coupled to the second coupling unit and outputting the amplified radio frequency signal from the second amplification stage;
    inductively coupling on the die a third coupling unit to the first coupling unit, the third coupling unit is shielded from the second coupling unit by routing the third coupling unit completely under the first coupling unit with the third coupling unit having a second width that is narrower than the first width; and
    providing radio frequency feedback to the input terminal of the first amplification stage through a radio frequency feedback path from the third coupling unit to the first coupling unit.

13. The method of claim 12 further comprising operating the second amplification stage on differential signals.

14. The method of claim 13 further comprising operating the first amplification stage on single-ended signals.

15. The method of claim 12 further comprising converting a single-ended first amplification stage signal into a differential signal to drive the second amplification stage.

16. The method of claim 12 further comprising connecting the first coupling unit between a ground terminal and a collector of a bipolar transistor.

17. The method of claim 12 further comprising connecting the third coupling unit between a ground terminal and a base of a bipolar transistor in the first amplification stage.

18. The method of claim 17 further comprising providing a first capacitor between a collector and the base of the bipolar transistor and a second capacitor in the radio frequency feedback path between the third coupling unit and the base of the bipolar transistor.

19. A mobile device comprising:
    a transceiver configured to generate a radio frequency signal;
    a first amplification stage on a die having an input terminal receiving a radio frequency signal to be amplified and having a first coupling unit with a first width;
    a second amplification stage on the die outputting an amplified radio frequency signal and having a second coupling unit that is inductively coupled with the first coupling unit; and
    a third coupling unit on the die inductively coupled with the first coupling unit, the third coupling unit provides radio frequency-coupled feedback to the input terminal of the first amplification stage through a radio frequency-coupled feedback path, the third coupling unit is shielded from the second coupling unit by routing the third coupling unit completely under the first coupling unit with the third coupling unit having a second width that is narrower than the first width.

20. The mobile device of claim 19 wherein the first and second coupling units form an inter-stage balun between the first and second amplification stages to convert a single-ended first amplification stage signal into a differential signal to drive the second amplification stage.

* * * * *